United States Patent
Terada et al.

(10) Patent No.: US 9,110,234 B2
(45) Date of Patent: Aug. 18, 2015

(54) OPTICAL MODULE AND OPTICAL WIRING BOARD

(75) Inventors: Kenji Terada, Yasu (JP); Kimihiro Yamanaka, Yasu (JP)

(73) Assignee: KYOCERA Corporation, Kyoto (JP)

( * ) Notice: Subject to any disclaimer, the term of this patent is extended or adjusted under 35 U.S.C. 154(b) by 175 days.

(21) Appl. No.: 13/976,924

(22) PCT Filed: Dec. 26, 2011

(86) PCT No.: PCT/JP2011/080005
§ 371 (c)(1),
(2), (4) Date: Jun. 27, 2013

(87) PCT Pub. No.: WO2012/090901
PCT Pub. Date: Jul. 5, 2012

(65) Prior Publication Data
US 2013/0272648 A1 Oct. 17, 2013

(30) Foreign Application Priority Data
Dec. 28, 2010 (JP) ................................. 2010-291439

(51) Int. Cl.
| | |
|---|---|
| *G02B 6/12* | (2006.01) |
| *G02B 6/122* | (2006.01) |
| *G02B 6/43* | (2006.01) |
| *H05K 1/02* | (2006.01) |
| *G02B 6/42* | (2006.01) |

(Continued)

(52) U.S. Cl.
CPC *G02B 6/122* (2013.01); *G02B 6/43* (2013.01); *H05K 1/0274* (2013.01); *G02B 6/4214* (2013.01); *H05K 1/113* (2013.01); *H05K 3/3436* (2013.01); *H05K 2201/10121* (2013.01)

(58) Field of Classification Search
USPC ........................................................ 385/14
See application file for complete search history.

(56) References Cited

U.S. PATENT DOCUMENTS

| | | |
|---|---|---|
| 6,438,281 B1 | 8/2002 | Tsukamoto et al. |
| 2003/0128907 A1 | 7/2003 | Kikuchi et al. |

(Continued)

FOREIGN PATENT DOCUMENTS

| | | |
|---|---|---|
| JP | 2000-347051 A | 12/2000 |
| JP | 2001-174657 A | 6/2001 |

(Continued)

OTHER PUBLICATIONS

International Search Report dated Feb. 28, 2012, issued for International Application No. PCT/JP2011/080005.

*Primary Examiner* — Sung Pak
(74) *Attorney, Agent, or Firm* — Procopio, Cory, Hargreaves & Savitch LLP

(57) ABSTRACT

An optical module includes: a wiring substrate having an electrode pad on a main surface thereof; an optical waveguide disposed on the main surface of the wiring substrate; an optical semiconductor device mounted on a main surface of the optical waveguide, and having a connection pad disposed on a main surface on an optical waveguide side of the optical semiconductor device; and an electrically conductive member for providing electrical connection between the electrode pad and the connection pad. The optical waveguide has a hole passing therethrough in its thickness direction to leave the electrode pad exposed. The connection pad includes a projection which is at least partly inserted in the hole. The conductive member is disposed inside the hole, and makes connection with the projection and the electrode pad.

10 Claims, 12 Drawing Sheets

(51) Int. Cl.
*H05K 1/11* (2006.01)
*H05K 3/34* (2006.01)

(56) References Cited

U.S. PATENT DOCUMENTS

| | | |
|---|---|---|
| 2009/0245720 A1 | 10/2009 | Choki et al. |
| 2010/0226606 A1* | 9/2010 | Choki et al. .................... 385/14 |
| 2014/0285989 A1* | 9/2014 | Kubota et al. .................. 361/767 |
| 2014/0370710 A1* | 12/2014 | Kitamura et al. ............. 438/701 |

FOREIGN PATENT DOCUMENTS

| | | |
|---|---|---|
| JP | 2003-161853 A | 6/2003 |
| JP | 2006-171642 A | 6/2006 |
| JP | 2007-199657 A | 8/2007 |
| JP | 2008-112030 A | 5/2008 |
| JP | 2008-158474 A | 10/2008 |
| JP | 2009-145867 A | 7/2009 |
| WO | 2007/139155 A1 | 12/2007 |

\* cited by examiner (a)

(b)

(a)

(b)

(a)

(b)

(a)

(b)

(c)

(d)

(a)

(b)

(c)

(a)

(b)

(c)

(a)

(b)

(c)

(a)

(b)

(a)

(b)

(a)

(b)

OPTICAL MODULE AND OPTICAL WIRING BOARD

TECHNICAL FIELD

The present invention relates to an optical module and an optical wiring board for use in electronic equipment (for example, various types of audio visual equipment, household electrical appliances, communications equipment, computer apparatuses, and peripheral equipment thereof) and so forth.

BACKGROUND ART

In recent years, an optical module in which an optical semiconductor device is mounted on an optical wiring board, has come to be utilized in electronic equipment. The optical wiring board includes a wiring substrate for transmission of electric signals, and an optical waveguide formed on the wiring substrate, for transmission of optical signals.

For example, in Japanese Unexamined Patent Publication JP-A 2000-347051, there is disclosed a mounting board (optical module) comprising a substrate having electrical wiring (wiring substrate); an optical wiring layer formed on the substrate (optical waveguide); an optical component mounted on the optical wiring layer (optical semiconductor device); a pad placed on the optical wiring layer, to which is soldered the optical component; and a via-hole formed so as to pass through the optical wiring layer in its thickness direction, for providing connection between the pad and the electrical wiring.

However, when the optical component is soldered to the pad placed on the optical wiring layer, the interposition of solder between the optical component and the pad placed on the optical wiring layer may result in an increase in the distance between the optical component and the optical wiring layer. Therefore, light that has been emitted to the optical wiring layer from the optical component, or light that the optical component received from the optical wiring layer, is prone to diffusion between the optical component and the optical wiring layer. In consequence, optical signals become susceptible to attenuation between the optical component and the optical wiring layer, which may cause deterioration in signal transmission characteristics of the mounting board.

SUMMARY OF THE INVENTION

The invention provides an optical module and an optical wiring board that satisfy a requirement to improve signal transmission characteristics.

An optical module in accordance with one embodiment of the invention comprises: a wiring substrate having an electrode pad on a main surface thereof; an optical waveguide disposed on the main surface of the wiring substrate; an optical semiconductor device mounted on a main surface of the optical waveguide opposite to the wiring substrate, the optical semiconductor device effecting emission of light to be transmitted to the optical waveguide or reception of light transmitted from the optical waveguide, and having a connection pad disposed on a main surface on an optical waveguide side of the optical semiconductor device; and an electrically conductive member for providing electrical connection between the electrode pad and the connection pad. The optical waveguide has a penetrating hole passing therethrough in its thickness direction to leave the electrode pad exposed. The connection pad includes a projection which is at least partly inserted in the penetrating hole. The conductive member is disposed inside the penetrating hole, and makes connection with the projection and the electrode pad.

An optical wiring board in accordance with one embodiment of the invention comprises a wiring substrate having an electrode pad disposed on a main surface thereof, and an optical waveguide disposed on the main surface of the wiring substrate. The optical waveguide has a penetrating hole passing therethrough in its thickness direction to leave the electrode pad exposed.

According to an optical module of one embodiment of the invention, the connection pad of the optical semiconductor device has a projection which is at least partly inserted in the penetrating hole of the optical waveguide, and the projection is connected, through the conductive member disposed inside the penetrating hole, to the electrode pad of the wiring substrate. Accordingly, the distance between the optical semiconductor device and the optical waveguide can be reduced. This makes it possible to increase the efficiency of transmission of optical signals between the optical semiconductor device and the optical waveguide, wherefore an optical module which excels in signal transmission characteristics can be obtained.

Moreover, according to an optical wiring board of one embodiment of the invention, the optical module can be produced by mounting the optical semiconductor device on the optical wiring board.

DESCRIPTION OF EMBODIMENTS

First Embodiment

Figure 1:
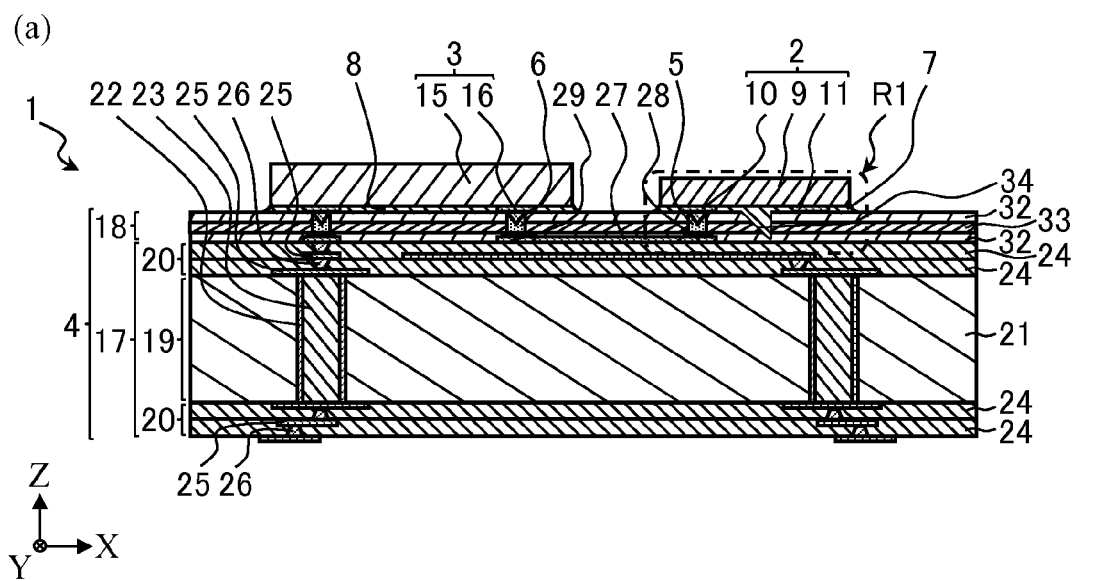
FIG. 1(a) is a thickness-wise sectional view of an optical module in accordance with a first embodiment of the invention.
FIG. 1(b) is an enlarged sectional view of a part R1 of FIG. 1(a)
Figure 1:
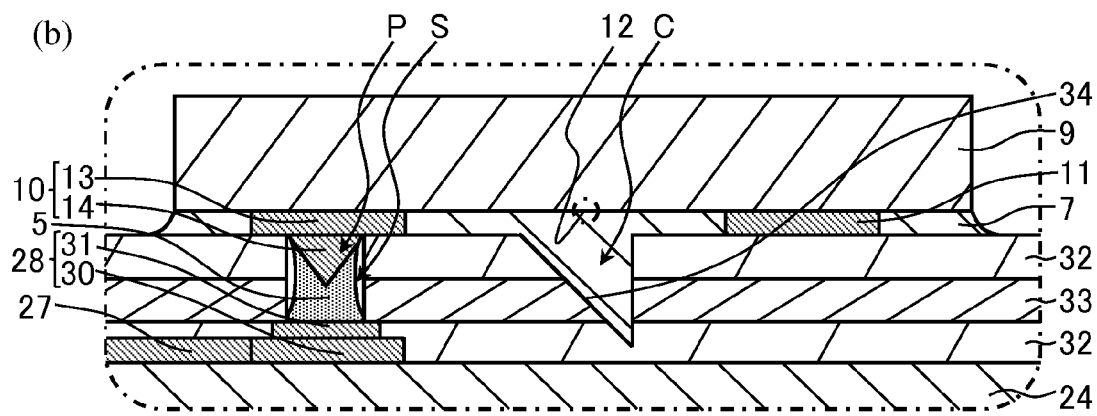
Figure 2:
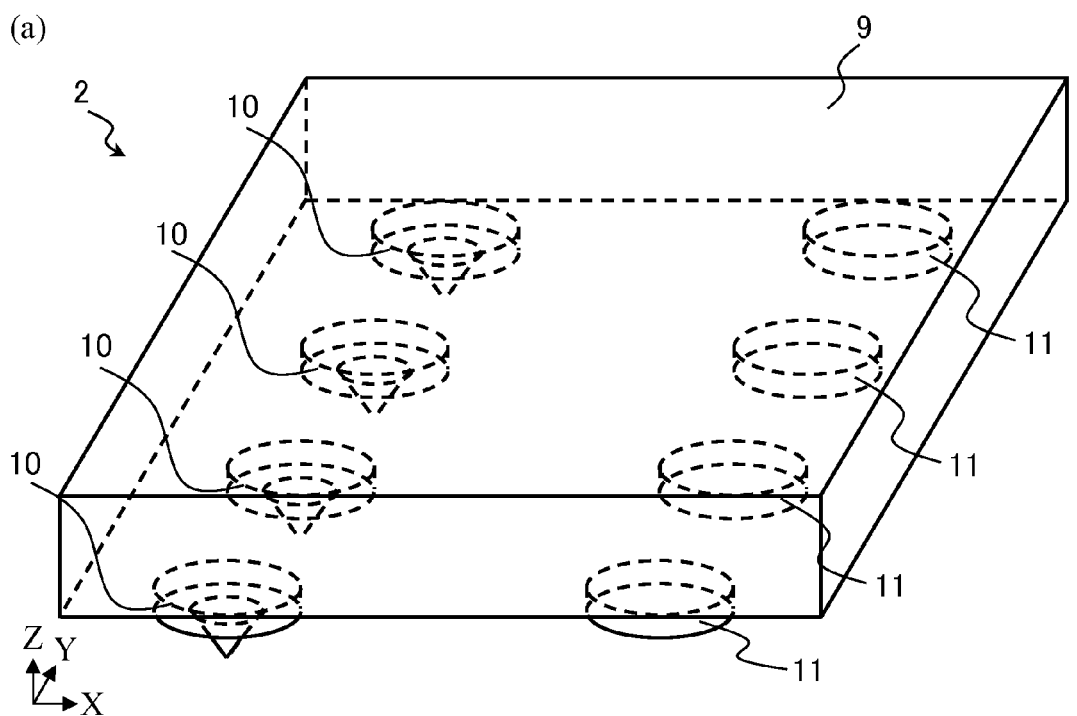
FIG. 2(a) is a three-dimensional representation of an optical semiconductor device of the optical module shown in FIG. 1(a)
FIG. 2(b) is a three-dimensional representation of an optical waveguide of the optical module shown in FIG. 1(a)
Figure 2:
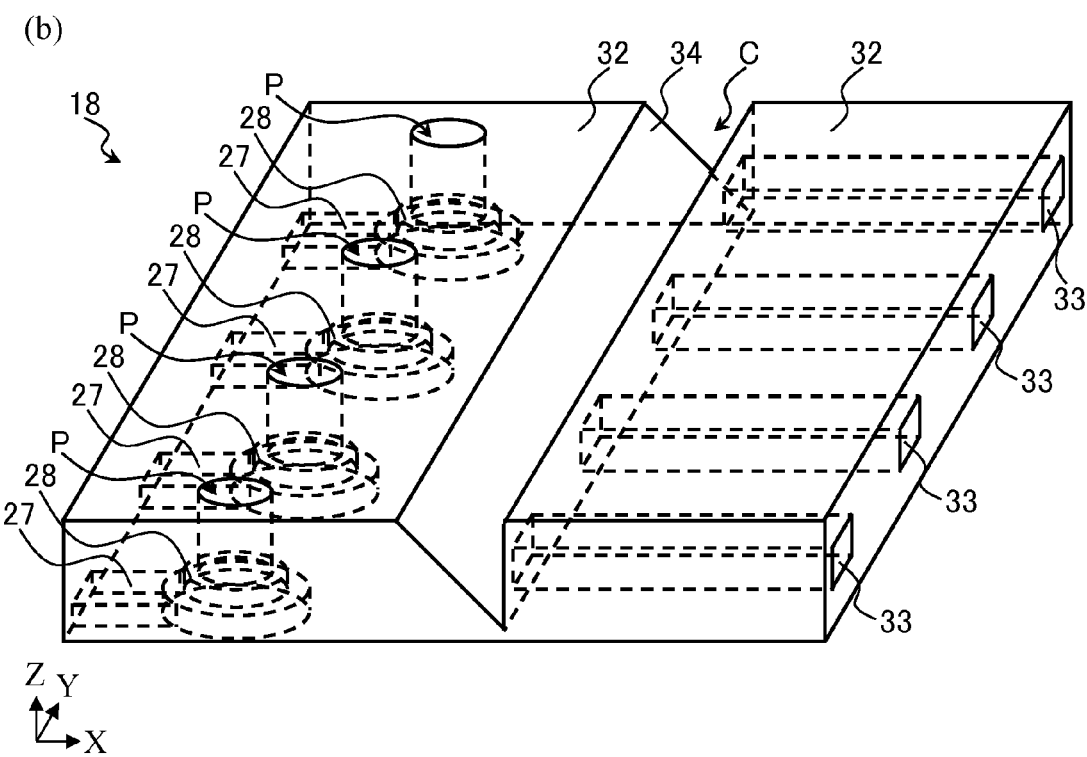
Figure 3:
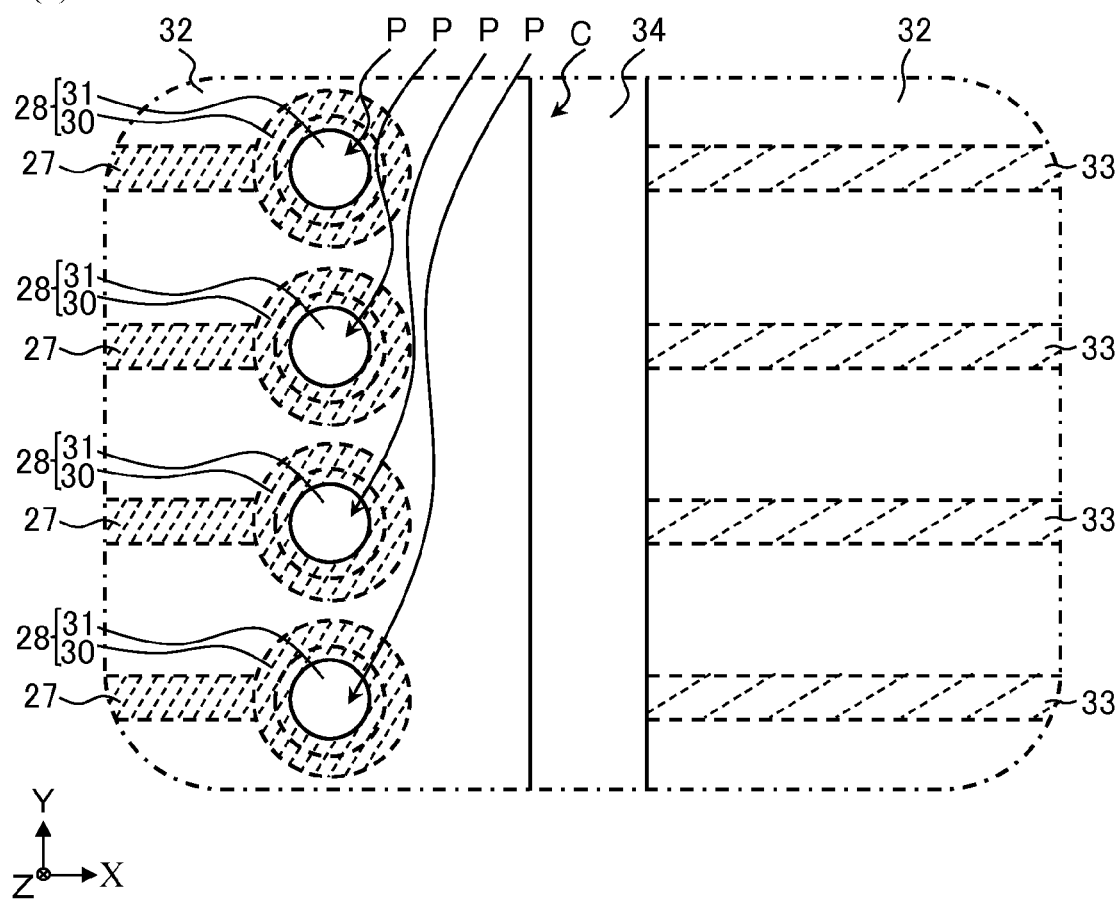
FIG. 3(a) is a top view of the construction shown in FIG. 2(b)
FIG. 3(b) is a three-dimensional representation showing the structure of connection between an electrode pad and a connection pad of the optical module shown in FIG. 1(a)
Figure 3:
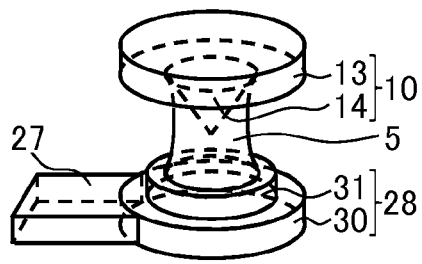

Hereinafter, an optical module including an optical wiring board in accordance with a first embodiment of the invention will be described in detail with reference to FIGS. 1 to 8.

(Optical Module)

An optical module 1 as shown in FIGS. 1(a) and 1(b) is used in electronic equipment such for example as various types of audio visual equipment, household electrical appliances, communications equipment, computer apparatuses, and peripheral equipment thereof.

The optical module 1 includes an optical semiconductor device 2 for performing inputting and outputting of optical signals; a semiconductor device 3 for performing conversion of electric signals; an optical wiring board 4, on which the optical semiconductor device 2 and the semiconductor device 3 are flip-chip mounted, for transmitting optical signals and electric signals; electrically conductive members 5 and 6 for providing electrical and mechanical connection between the optical semiconductor device 2 or the semiconductor device 3 and the optical wiring board 4; and insulating members 7 and 8 for providing mechanical connection between the optical semiconductor device 2 or the semiconductor device 3 and the optical wiring board 4.

In the optical module 1, an optical signal is transmitted between the optical semiconductor device 2 and an external module through the optical wiring board 4. Moreover, an electric signal is transmitted between the optical semiconductor device 2 and the semiconductor device 3, as well as between the semiconductor device 3 and an external circuit, through the conductive member 5, 6 and the optical wiring board 4.

(Optical Semiconductor Device)

As shown in FIG. 2(a), the optical semiconductor device 2 includes an optical semiconductor substrate 9, and a connection pad 10 and a dummy pad 11 which are formed on a main surface on the optical wiring board 4 side of the optical semiconductor substrate 9.

The optical semiconductor substrate 9 serves as, for example, a light-emitting device or a light-receiving device, and thus includes a light-receiving or light-emitting section 12 for light emission or light reception. The light-emitting device converts an electric signal (analog signal) fed from the optical wiring board 4 into an optical signal, and feed the optical signal to the optical wiring board 4 (light emission), and, for example, a surface-emitting type semiconductor laser can be used for the light-emitting device. On the other hand, the light-receiving device converts an optical signal fed thereto (received therein) from the optical wiring board 4 into an electric signal (analog signal), and feed the electric signal to the optical wiring board 4, and, for example, a photodiode can be used for the light-receiving device.

The optical semiconductor substrate 9 can be made of a semiconductor material such for example as silicon or gallium arsenide. The thickness of the optical semiconductor substrate 9 is adjusted to fall in a range of 0.1 mm or more and 1 mm or less, for example.

The connection pad 10, which is electrically and mechanically connected to the conductive member 5, serves as a terminal for connecting the optical semiconductor device 2 to the optical wiring board 4. The connection pad 10 includes a flat pad portion 13 formed on the main surface of the optical semiconductor substrate 9, and a projection 14 connected to part of a main surface of the pad portion 13 opposite to the optical semiconductor substrate 9.

The pad portion 13 of the connection pad 10 can be made of an electrically-conductive material such for example as copper, gold, aluminum, nickel, or chromium. The pad portion 13 is given a cylindrical shape, for example. The planar diameter (diameter) of the pad portion 13 is adjusted to fall in a range of 60 μm or more and 100 μm or less, for example. The thickness of the pad portion 13 is adjusted to fall in a range of 0.1 μm or more and 10 μm or less, for example.

While the projection 14 of the connection pad 10 can be made of an electrically-conductive material such for example as copper, gold, nickel, or chromium, it is particularly desirable to form it of the same material as that used for the pad portion 13. The projection 14 is given a conical shape, for example. The planar diameter of the projection 14 is adjusted to fall in a range of 60 μm or more and 90 μm or less, for example. The height of the projection 14 is adjusted to fall in a range of 50 μm or more and 70 μm or less, for example.

The dummy pad 11 is not electrically connected to the optical wiring board 4, and has the effect of lessening the inclination of the optical semiconductor device 2 ascribable to the connection pad 10. The dummy pad 11 can be made for example of an electrically-conductive material similar to that used for the pad portion 13. Moreover, the dummy pad 11 is given a cylindrical shape, for example. The planar diameter of the dummy pad 11 is adjusted to fall in a range of 60 μm or more and 100 μm or less, for example. The thickness of the dummy pad 11 is adjusted to fall in a range of 0.1 μm or more and 10 μm or less, for example.

(Semiconductor Device)

The semiconductor device 3 includes a semiconductor substrate 15, and a connection pad 16 formed on a main surface on the optical wiring board 4 side of the semiconductor substrate 6.

The semiconductor substrate 15 effects electric-signal conversion, for converting between digital and analog signals. For example, IC or LSI can be adopted for the semiconductor substrate 15, and the semiconductor substrate 15 can be made of a semiconductor material such for example as silicon. The thickness of the semiconductor substrate 15 is adjusted to fall in a range of 0.1 mm or more and 1 mm or less, for example.

The connection pad 16, which is electrically and mechanically connected to the conductive member 6, serves as a terminal for connecting the semiconductor device 3 to the optical wiring board 4. The connection pad 16 is structurally similar to the connection pad 10 of the optical semiconductor device.

(Optical Wiring Board)

The optical wiring board 4 includes a wiring substrate 17, and an optical waveguide 18 formed on the wiring substrate 17, on which are mounted the optical semiconductor device 2 and the semiconductor device 3.

(Wiring Substrate)

The wiring substrate 17 transmits grounding power, mains power, or electric signals while enhancing the rigidity of the optical wiring board 4. The wiring substrate 17 includes a core substrate 19, and a pair of wiring layers 20 formed on upper and lower surfaces, respectively, of the core substrate 19.

The core substrate 19 enhances the rigidity of the wiring substrate 17, as well as to provide electrical connection between the pair of wiring layers 20. The core substrate 19 includes a resin substrate 21, a tubular through-hole conductor 22 formed so as to pass through the resin substrate 21 in its thickness direction, and an insulator 23 filled in a region surrounded by the through-hole conductor 22.

The resin substrate 21 enhances the rigidity of the core substrate 19. The resin substrate 21 includes, for example, a glass cloth and epoxy resin covering the glass cloth. The thickness of the resin substrate 21 is adjusted to fall in a range of 0.1 mm or more and 3.0 mm or less, for example.

The through-hole conductor 22 provides electrical connection between the pair of wiring layers 20. The through-hole conductor 22 can be made of an electrically-conductive material such for example as copper, silver, gold, aluminum, nickel, or chromium.

The insulator 23 can be made of a resin material such for example as epoxy resin.

The wiring layer 20 increases the density of electrical wiring in the wiring substrate 17. The wiring layer 20 includes a plurality of insulating layers 24 laminated on the core substrate 19, a plurality of electrically conductive layers 25 formed on the core substrate 19 or on the insulating layers 24, and a plurality of via-conductors 26 formed so as to pass through the insulating layers 24 in its thickness direction for connection with the conductive layers 25. The conductive layer 25 and the via-conductor 26 are electrically connected to each other, for constituting electrical wiring including grounding wiring, and power supply wiring and/or signal wiring.

The insulating layer 24 supports the conductive layer 25, as well as to prevent short-circuiting between the individual conductive layers 25. The insulating layer 24 can be made of a resin material such for example as epoxy resin or polyimide resin. The thickness of the insulating layer 24 is adjusted to fall in a range of 10 μm or more and 50 μm or less, for example. Preferably, the insulating layer 24 contains an inorganic insulating filler made of an inorganic insulating material such as silicon oxide or the like.

The conductive layer 25 transmits grounding power, mains power, or electric signals. The conductive layer 25 can be made of an electrically-conductive material such for example as copper, silver, gold, aluminum, nickel, or chromium. The thickness of the conductive layer 25 is adjusted to fall in a range of 3 μm or more and 20 μm or less, for example.

Among the plural conductive layers 25, the conductive layer 25 disposed on the main surface on the optical waveguide 18 side of the wiring substrate 17 includes a narrow strip of wiring conductor 27, and a flat electrode pad 28, 29 connected to each end of the wiring conductor. The wiring conductor 27 and the electrode pad 28, 29 transmit electric signals between the optical semiconductor device 2 and the semiconductor device 3. Moreover, as shown in FIGS. 2(b) and 3(a), a plurality of wiring conductors 27, as well as a plurality of electrode pads 28, 29, are formed so as to lie in parallel with each other in the planar direction. By arranging the wiring conductors 27 and the electrode pads 28, 29 in this way, the optical semiconductor device 2 and the semiconductor device 3 can be electrically connected to each other with high efficiency.

The wiring conductor 27 transmits electric signals between the electrode pads 28 and 29 connected to its ends, respectively. The width of the wiring conductor 27 is adjusted to fall in a range of 5 μm or more and 30 μm or less, for example. The thickness of the wiring conductor 27 is adjusted to fall in a range of 3 μm or more and 20 μm or less, for example. Moreover, the wiring conductor 27 has its longitudinal direction from the optical semiconductor device 2 toward the semiconductor device 3 (X direction), and a plurality of wiring conductors 27 are formed so that their longitudinal directions become parallel to each other.

The electrode pad 28, 29 serves as a terminal which is electrically and mechanically connected to the conductive member 5, 6. The electrode pad 28 is connected, through the conductive member 5, to the connection pad 10 of the optical semiconductor device 2. The electrode pad 29 is connected, through the conductive member 6, to the connection pad 16 of the semiconductor device 3.

The plurality of electrode pads 28 are formed so as to be aligned along a direction perpendicular to the longitudinal direction of the wiring conductor 27 (Y direction). Just like the electrode pads 28, the plurality of electrode pads 29 are formed so as to be aligned along a direction perpendicular to the longitudinal direction of the wiring conductor 27 (Y direction). Such an arrangement of the electrode pads 28, 29 allows reduction of the length of the wiring conductor connecting the electrode pads 28 and 29.

Moreover, the electrode pad 28, 29 includes a flat land portion 30 connected to an end of the wiring conductor 27, and a protrusion 31 connected to part of the main surface on the optical waveguide 18 side of the land portion 30.

The land portion 30 is interposed between the insulating layer 24 and the optical waveguide 18, and a region of its main surface on the optical waveguide side which is not connected with the protrusion 31 abuts on the optical waveguide 18. The land portion 30 is given a cylindrical shape, for example. Moreover, the land portion 30 is larger in planar diameter and in thickness than the protrusion 31. The planar diameter of the land portion 30 is adjusted to fall in a range of 60 μm or more and 100 μm or less, for example, so as to be 0.6 or more to 0.9 or less times as large as the planar diameter of the protrusion 31, for example. Further, the thickness of the land portion 30 is adjusted to fall in a range of 10 μm or more and 20 μm or less, for example, so as to be 0.6 or more to 0.9 or less times as large as the thickness of the protrusion 31, for example.

Moreover, the protrusion 31 protrudes from the land portion 30 toward a penetrating hole P of the optical waveguide 18 which will hereafter be described, and part of its main surface is left exposed inside the penetrating hole P. Further, in the protrusion 31, that region of its main surface on the optical waveguide 18 side which is not exposed inside the penetrating hole P abuts on the optical waveguide 18, and, the protrusion 31 is larger in planar diameter than the penetrating hole P. The protrusion 31 is given a cylindrical shape, for example. The planar diameter of the protrusion 31 is adjusted to fall in a range of 50 µm or more and 90 µm or less, for example, so as to be 0.6 or more to 0.9 or less times as large as the planar diameter of the penetrating hole P, for example. Moreover, the thickness of the protrusion 31 is adjusted to fall in a range of 5 µm or more and 15 µm or less, for example.

The via-conductor 26 provides electrical connection between the conductive layers 25 spaced apart in the thickness direction, with the insulating layer 24 lying between them. The via-conductor 26 can be made of an electrically-conductive material such for example as copper, gold, nickel, or chromium. The via-conductor 26 has the form of a column tapered in a direction toward the core substrate 19, and is circular in planar shape. The planar diameter of the via-conductor 26 is adjusted to fall in a range of 25 µm or more and 100 µm or less, for example, and the height of the via-conductor 26 is adjusted to fall in a range of 10 µm or more and 50 µm or less, for example.

(Optical Waveguide)

The optical waveguide 18 has the capability of transmission of optical signals. As shown in FIGS. 2(b) and 3(a), the optical waveguide 18 includes a flat cladding layer 32 formed on the wiring substrate 17; a narrow strip of core layer 33 surrounded by the cladding layer 32; a notch C located immediately below the light-receiving or light-emitting section 12 of the optical semiconductor device 2, which is created by recessing the optical waveguide 18 along its thickness direction from the main surface on the optical semiconductor device 2 side of the optical waveguide 18; an optical-path changing member 34 formed in the notch C; and a penetrating hole P formed so as to pass through the optical waveguide 18 in its thickness direction to leave the electrode pad 28, 29 of the wiring substrate 17 exposed. Note that the notch C may pass through the optical waveguide 18 in its thickness direction so as to reach the wiring substrate 17.

The cladding layer 32 serves as a protective member for the core layer 33, and also has the capability of confinement of optical signals within the core layer 33. The cladding layer 32 can be made of a light-transmittable material such for example as epoxy resin, acrylic resin, polysilanol resin, polysilane resin, polyimide resin, silicone-based resin, polystyrene-based resin, polycarbonate-based resin, polyamide-based resin, polyester-based resin, phenol-based resin, polyquinoline-based resin, polyquinoxaline-based resin, polybenzoxazole-based resin, polybenzothiazole-based resin, and polybenzoimidazol-based resin. The transmittancy of the cladding layer 32 is adjusted to fall in a range of 80% or more and 100% or less, for example. The refractive index of the cladding layer 32 is adjusted to fall in a range of 1.4 or more and 1.6 or less, for example. Moreover, the thickness of the cladding layer 32 is adjusted to fall in a range of 45 µm or more and 85 µm or less, for example. Note that the transmittancy is determined by a measurement method defined in compliance with ISO 13468-1: 1996, and the refractive index is determined by a measurement method defined in compliance with ISO 489: 1999.

The core layer 33, which is higher in refractive index than the cladding layer 32, acts to effect transmission of an optical signal by allowing the optical signal to undergo total reflection at the interface between the core layer 33 and the cladding layer 32. The core layer 31 can be made of a light-transmittable material similar to that used for the cladding layer. The light transmittancy of the core layer 33 is adjusted to fall in a range of 95% or more and 100% or less, for example. The refractive index of the core layer 33 is adjusted to fall in a range of 1.4 or more and 1.6 or less, for example, so as to be 1.0001 or more to 1.1 or less times as large as the refractive index of the cladding layer 32, for example.

Moreover, the core layer 33 is given a rectangular parallelepiped shape, for example. The width of the core layer 33 is adjusted to fall in a range of 10 µm or more and 50 µm or less, for example. The thickness of the core layer 33 is adjusted to fall in a range of 10 µm or more and 50 µm or less, for example. Further, as shown in FIGS. 2(b) and 3(a), a plurality of core layers 33 are formed so that their longitudinal directions become parallel to each other in the planar direction, and, the core layer 33 is located on a line extended from the wiring conductor 27 when viewed in a plan view. Note that the core layer 33 may be located between the lines extended from two wiring conductors 27, respectively.

The notch C, which is a space surrounded by a vertical section perpendicular to the longitudinal direction of the core layer 33 (X direction) and an inclined face obtained by inclining the vertical section about a pivot axis defined by a width direction of the core layer 33 (Y direction), has the form of a narrow strip extending along the width direction of the core layer 33. The vertical section bears the end faces of the plural core layers 33 through which optical signals travel, and the height (Z-wise length) of the vertical section is adjusted to fall in a range of 20 µm or more and 150 µm or less, for example. Moreover, the inclined face is formed immediately below the light-receiving or light-emitting section 12 of the optical semiconductor device 2, and the angle of inclination of the inclined face with respect to the lower surface of the cladding layer 32 is adjusted to fall in a range of 40 degrees or more and 50 degrees or less, for example.

The optical-path changing member 34, which has the form of a metallic film formed on the inclined face of the notch C, has the capability of changing the direction of transmission of optical signals. Specifically, where the optical semiconductor device 2 is a light-emitting device, the optical-path changing member 34 reflects an optical signal transmitted to the inclined face from the light-emitting section of the light-emitting device, whereby the direction of transmission of the optical signal is changed from the thickness direction (Z direction) to the longitudinal direction (X direction) for transmission of the optical signal to the core layer 33. Moreover, where the optical semiconductor device 2 is a light-receiving device for example, the optical-path changing member 34 reflects an optical signal transmitted to the inclined face from the core layer 33, whereby the direction of transmission of the optical signal is changed from the longitudinal direction (X direction) to the thickness direction (Z direction) for transmission of the optical signal to the light-receiving section of the light-receiving device. The optical-path changing member 34 can be made of a metal material such for example as gold. The height above the inclined face (thickness) of the optical-path changing member 34 is adjusted to fall in a range of 1000 Å or more and 5000 Å or less, for example.

The penetrating hole P is given a cylindrical shape, for example. The planar diameter of the penetrating hole P is adjusted to fall in a range of 50 µm or more and 90 µm or less, for example. Moreover, a plurality of penetrating holes P are formed to leave the electrode pads 28, 29 exposed on an individual basis.

(Electrically Conductive Member)

The conductive member 5, 6, which is disposed inside the penetrating hole P, serves as an electrically conductive bonding member. Specifically, the conductive member 5 provides electrical and mechanical connection between the connection pad 10 of the optical semiconductor device 2 and the electrode pad 28 of the wiring substrate 17. On the other hand, the conductive member 6 provides electrical and mechanical connection between the connection pad 16 of the semiconductor device 3 and the electrode pad 29 of the wiring substrate 17. In order to ensure bonding capability, the conductive member 5, 6 may be made of a metal material which is lower in melting point than the connection pad 10, 13 and the electrode pad 28, 29, and, as the metal material having a lower melting point, for example, solder containing tin, indium, or bismuth can be used. As shown in FIG. 3(b), the conductive member 5, 6 is shaped like a drum which is constricted in the middle in its thickness direction; that is, a clearance S is created between the conductive member and the inner wall of the penetrating hole P.

(Insulating Member)

The insulating member 7, 8, which is charged between the optical semiconductor device 2 or the semiconductor device 3 and the optical waveguide 18, serves as an insulating bonding member (underfill). Specifically, the insulating member 7 is charged between the optical semiconductor device 2 and the optical waveguide 18, for enhancing insulation property between the individual connection pads 10 of the optical semiconductor device 2 while establishing mechanical connection between the optical semiconductor device 2 and the optical waveguide 18. On the other hand, the insulating member 8 is charged between the semiconductor device 3 and the optical waveguide 18, for enhancing insulation property between the individual connection pads 16 of the semiconductor device 3 while establishing mechanical connection between the semiconductor device 3 and the optical waveguide 18.

Moreover, the insulating member 7 is charged in the notch C of the optical waveguide 18 for sealing purpose, and acts to prevent deformation of the notch C, as well as to prevent separation of the optical-path changing member (metallic film). In order to secure an optical path between the optical semiconductor device 2 and the optical waveguide 18, the insulating member 7 may be made of a light-transmittable material. As the light-transmittable material, a resin material such for example as epoxy resin or acrylic resin can be used, and, the transmittancy of the light-transmittable material is adjusted to fall in a range of 95% or more and 100% or less, for example. Moreover, the insulating member 8 can be made of a resin material such for example as epoxy resin or acrylic resin, and particularly, the insulating member 8 should preferably be made of the same resin material as that used for the insulating member 7. Note that, of the insulating members 7 and 8, the insulating member 8 alone charged between the semiconductor device 3 and the optical waveguide 18 may contain an inorganic insulating filler made of silicon oxide or the like.

(Mounting Structure)

Next, a detailed description will be given below as to a structure for mounting the optical semiconductor device 2 on the optical wiring board 4 in the optical module 1 of the present embodiment.

In the optical module 1 of this embodiment, as shown in FIGS. 1(b) and 3(b), the connection pad 10 of the optical semiconductor device 2 has the projection 14 jutting into the electrode pad 28 of the wiring substrate 17, at least part of which is inserted into the penetrating hole P passing through the optical waveguide 18 in its thickness direction. Moreover, the conductive member 5 is disposed inside the penetrating hole P, and makes connection with the projection 14 of the connection pad 10 and the electrode pad 28.

As a result, the connection pad 10 of the optical semiconductor device 2 and the electrode pad 28 of the wiring substrate 17 can be electrically connected to each other through the conductive member 5 disposed inside the penetrating hole P, and thus, as compared to a case where the optical semiconductor device and the wiring substrate are electrically connected to each other through a conductive member formed on the main surface of the optical waveguide, the distance between the optical semiconductor device 2 and the optical waveguide 18 can be reduced for mutual proximity. This makes it possible to lessen diffusion of light between the light-receiving or light-emitting section 12 of the optical semiconductor device 2 and the optical-path changing member 34 of the optical waveguide 18. Accordingly, the efficiency of transmission of optical signals between the optical semiconductor device 2 and the optical waveguide 18 can be increased, wherefore an optical module 1 which excels in signal transmission characteristics can be obtained.

In the case of forming a conductive member on the main surface of the optical waveguide, there is a need to form a through-conductor passing through the optical waveguide by means of plating or otherwise for the sake of electrical connection between the conductive member and the wiring substrate, and, in this regard, however, since the optical waveguide tends to be larger in thickness than the insulating layer because of the necessity of ensuring optical-signal transmission characteristics, it follows that the through-conductor becomes narrower with an increase in aspect ratio and is consequently susceptible to a break.

On the other hand, in the optical module 1 of this embodiment, the projection 14 of the connection pad 10 is inserted into the penetrating hole P so as to be mechanically connected, through the conductive member 5 serving as the electrically conductive bonding member in the penetrating hole P, to the electrode pad 28. Accordingly, in contrast to the case of forming the through-conductor in the optical waveguide as above described, it is possible to obtain an optical module 1 which excels in reliability of electrical connection between the optical semiconductor device 2 and the wiring substrate 17.

Moreover, since the conductive member 5 is disposed inside the penetrating hole P, it is possible to enhance insulation property between the adjacent conductive members 5 by the optical waveguide 18, and thereby suppress short-circuiting between the conductive members 5. Further, since the short-circuiting between the conductive members 5 can be suppressed without the necessity of providing a solder resist layer on the optical waveguide 18, it is possible to bring the optical semiconductor device 2 and the optical waveguide 18 nearer to each other.

Moreover, in this embodiment, in the connection pad 10 of the optical semiconductor device 2, part of the main surface on the optical waveguide 18 side of the pad portion 13 which is not connected with the projection 14 abuts on the cladding layer 32 of the optical waveguide 18. As a result, there exists no component such as a conductive member interposed between the pad portion 13 and the cladding layer 32, wherefore the optical semiconductor device 2 and the optical waveguide 18 become closer to each other, and also the inclination of the optical semiconductor device 2 relative to the optical waveguide 18 can be suppressed. This makes it possible to increase the efficiency of transmission of optical signals between the optical semiconductor device 2 and the optical waveguide 18.

Further, in this embodiment, the dummy pad 11 of the optical semiconductor device 2 abuts on the cladding layer 32 of the optical waveguide 18. As a result, there exists no component such as a conductive member interposed between the dummy pad 11 and the cladding layer 32, wherefore the inclination of the optical semiconductor device 2 relative to the optical waveguide 18 can be controlled with ease.

It is preferable that the dummy pad 11 is equal in thickness to the pad portion 13 of the connection pad 10. In consequence thereof, since the dummy pad 11 and the pad portion 13 abutting on the main surface of the optical waveguide 18 have the same thickness, it is possible to suppress the inclination of the optical semiconductor device 2 relative to the optical waveguide 18. In this case, the thickness of the dummy pad 11 is adjusted to be 0.9 or more to 1.1 or less times as large as the thickness of the pad portion 13, for example.

Moreover, in this embodiment, the electrode pad 28 has the protrusion 31 protruding from the land portion 30 toward the penetrating hole P for connection with the conductive member 5. As a result, the protrusion 31 is conducive to reduction in the distance between the electrode pad 28 and the connection pad 10, wherefore the strength of connection between the electrode pad 28 and the conductive member 5 can be increased.

The protrusion 31 is disposed in a layer region (first cladding layer) of the cladding layer 32 disposed under the core layer 33, and the thickness of the electrode pad 28 should preferably be smaller than the thickness of the first cladding layer. In this case, deformation of the core layer 33 can be suppressed.

In this embodiment, the structure for mounting the semiconductor device 3 is structurally similar to the structure for mounting the optical semiconductor device 2 thus far described.

Thus, the above-mentioned optical module 1 performs, where the optical semiconductor substrate 9 is a light-emitting device, the desired functions in the following manner. At first, a digital signal (electric signal) is transmitted from an external circuit to the semiconductor device 3 through the conductive layer 25 and the via-conductor 26, so that the digital signal can be converted into an analog signal (electric signal) in the semiconductor device 3. Subsequently, the analog signal is transmitted from the semiconductor device 3 to the optical semiconductor device 2 through the wiring conductor 27, so that the analog signal can be converted into an optical signal in the optical semiconductor device 2, Next, the optical signal is transmitted from the optical semiconductor device 2 to an external module through the optical-path changing member 34 and the core layer 33. In this way, the optical module 1 converts a digital signal (electric signal) transmitted thereto from the external circuit into an optical signal, and transmits the optical signal to the external module.

Moreover, the optical module 1 performs, where the optical semiconductor substrate 9 is a light-receiving device, the desired functions by transmitting each signal in the reverse fashion to the case where the optical semiconductor substrate 9 is a light-emitting device.

(Manufacture of Optical Module)

Next, a method for manufacturing the above-mentioned optical module 1 of the first embodiment will be explained with reference to FIGS. 4 to 8.

(Production of Optical Semiconductor Device and Semiconductor Device)

Figure 4:
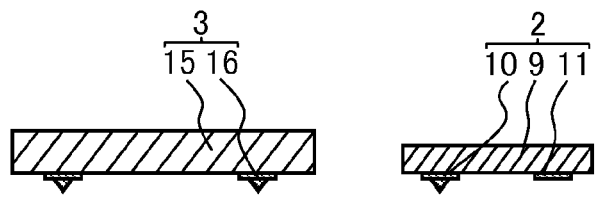
FIGS. 4(a) to 4(c) are thickness-wise sectional views of the optical module shown in FIG. 1(a), illustrating process steps for manufacturing the optical module.
FIG. 4(d) is an enlarged sectional view of a part R2 of FIG. 4(c), illustrating process steps for manufacturing the optical module.
Figure 4:
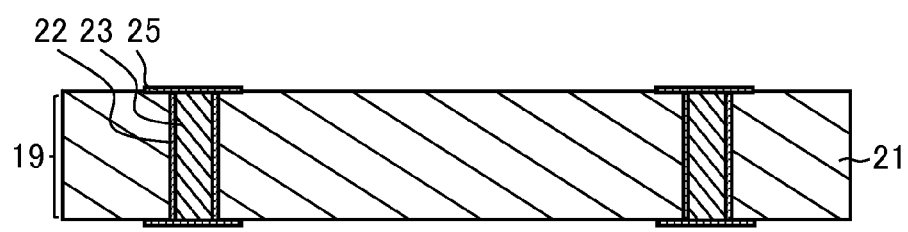
Figure 4:
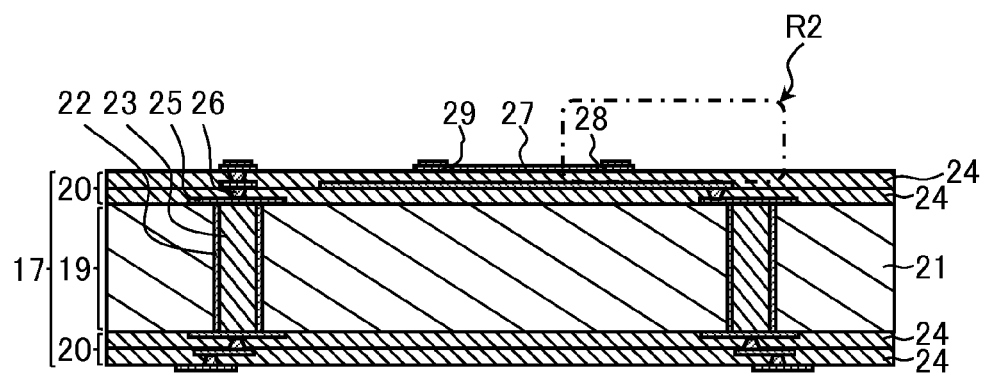
Figure 4:
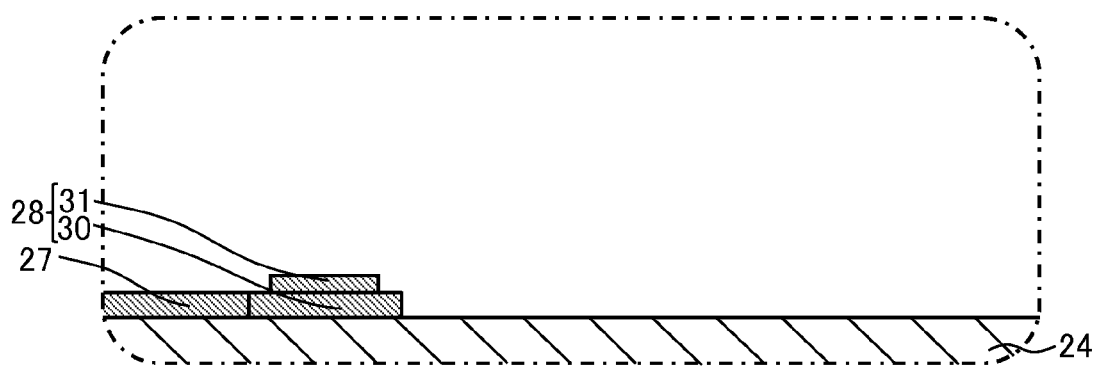

(1) As shown in FIG. 4(*a*), the optical semiconductor device 2 and the semiconductor device 3 are produced. The following is a concrete example of the procedure of production.

To begin with, the pad portion 13 and the dummy pad 11 are formed on the optical semiconductor substrate 9 by means of electrolytic plating, vapor deposition, CVD technique, sputtering, or otherwise. Then, the projection 14 is formed on the pad portion 13 by means of wire bonding thereby to form the connection pad 10 composed of the projection 14 and the pad portion 13.

In the manner as above described, the optical semiconductor device 2 can be fabricated. Moreover, the semiconductor device 3 can be fabricated similarly to the optical semiconductor device 2.

(Production of Wiring Substrate)

(2) As shown in FIG. 4(*b*), the core substrate 19 is produced. The following is a concrete example of the procedure of production.

At first, a base body is formed by stacking, for example, resin sheets in an uncured state on top of each other with subsequent curing treatment through application of heat and pressure. Note that the uncured state corresponds to an A-stage or a B-stage defined in compliance with ISO 472: 1999. Then, a penetrating hole is created so as to pass through the base body in its thickness direction by means of drilling, lasering, or otherwise. Next, the tubular through-hole conductor 22 is formed by depositing an electrically-conductive material on the inner wall of the penetrating hole by means of electroless plating, electrolytic plating, or otherwise. Moreover, an electrically-conductive material layer is formed by depositing an electrically-conductive material on upper and lower surfaces of the base body. Next, the insulator 11 is formed by charging a resin material into a region surrounded by the through-hole conductor 22. Subsequently, following the depositing of an electrically-conductive material on the exposed part of the insulator 11, the electrically-conductive material layer is subjected to patterning process using heretofore known technique such as photolithography, etching, or the like, thereby forming the conductive layer 25.

In the manner as above described, the core substrate 19 can be fabricated.

(3) As shown in FIG. 4(*c*), the wiring substrate 17 is produced by forming a pair of wiring layers 20 on both sides of the core substrate 19. The following is a concrete example of the procedure of production.

At first, the insulating layer 24 is formed on the core substrate 19 by placing an uncured resin on the core substrate 19, applying heat to the resin so that it can flow thereon into a state of adhering tightly to the core substrate, and curing the resin by further application of heat. Then, a via-hole is created in the insulating layer 24 by lasering technique for example, and the conductive layer 25 is at least partly left exposed inside the via-hole. Next, by means of semi-additive method involving electroless plating and electrolytic plating, subtractive method, full-additive method, or otherwise, the via-conductor 13 is formed inside the via-hole, and also the conductive layer 25 is formed on the insulating layer 24. By repeating such process steps, the wiring layer 20 can be formed.

At the time of forming the conductive layer 25 on the insulating layer 24 which becomes an outermost layer, the wiring conductor 27 and the land portion 30 are formed by means of patterning. Moreover, following the formation of the land portion 30, as shown in FIG. 4(*d*), the protrusion 31 is formed on the land portion 30 by means of the semi-additive method involving electroless plating and electrolytic plating, the subtractive method, the full-additive method, or otherwise. So long as the protrusion 31 is smaller in planar diameter and in thickness than the land portion 30, the protrusion 31 can be formed on the land portion 30 with ease.

In the manner as above described, the wiring substrate 17 can be fabricated.

(Formation of Optical Waveguide)

Figure 5:
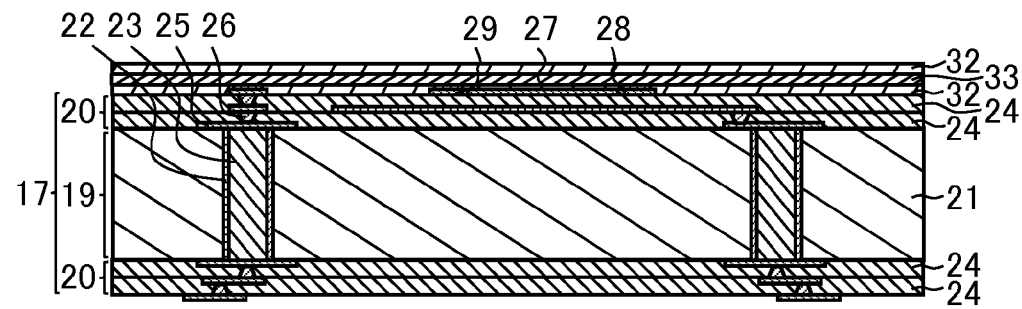
FIGS. 5(a) and 5(b) are thickness-wise sectional views of the optical module shown in FIG. 1(a), illustrating process steps for manufacturing the optical module.
FIG. 5(c) is an enlarged sectional view of a part R3 of FIG. 5(b), illustrating process steps for manufacturing the optical module.
Figure 5:
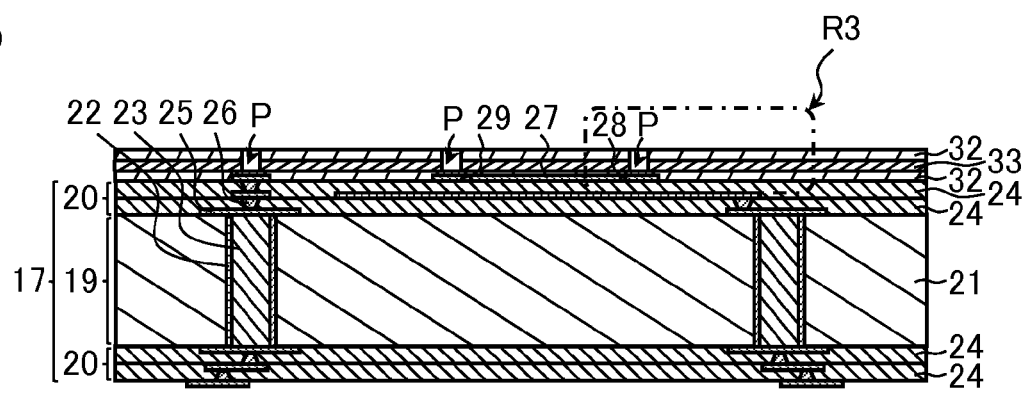
Figure 5:
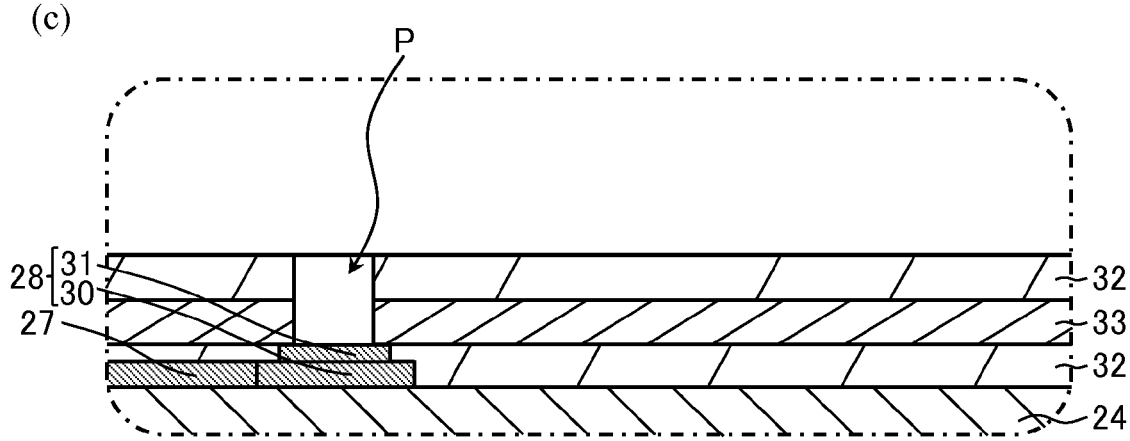
Figure 6:
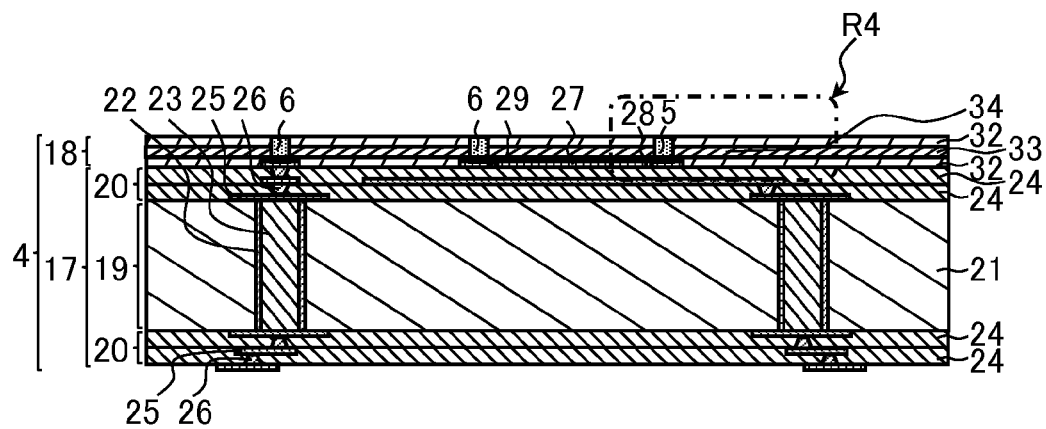
FIGS. 6(a) and 6(c) are thickness-wise sectional views of the optical module shown in FIG. 1(a), illustrating process steps for manufacturing the optical module.
FIG. 6(b) is an enlarged sectional view of a part R4 of FIG. 6(a), illustrating process steps for manufacturing the optical module.
Figure 6:
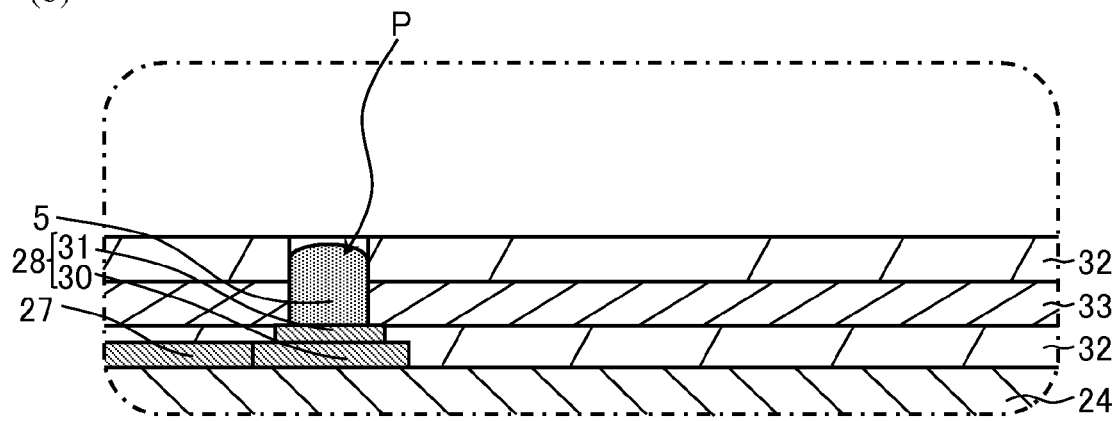
Figure 6:
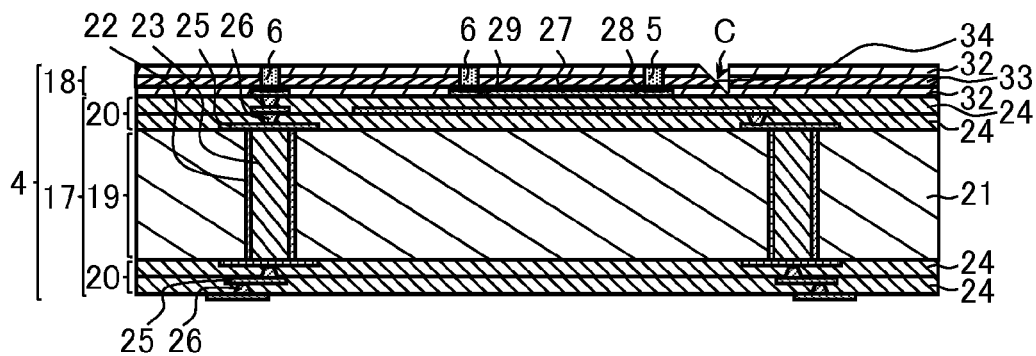
Figure 7:
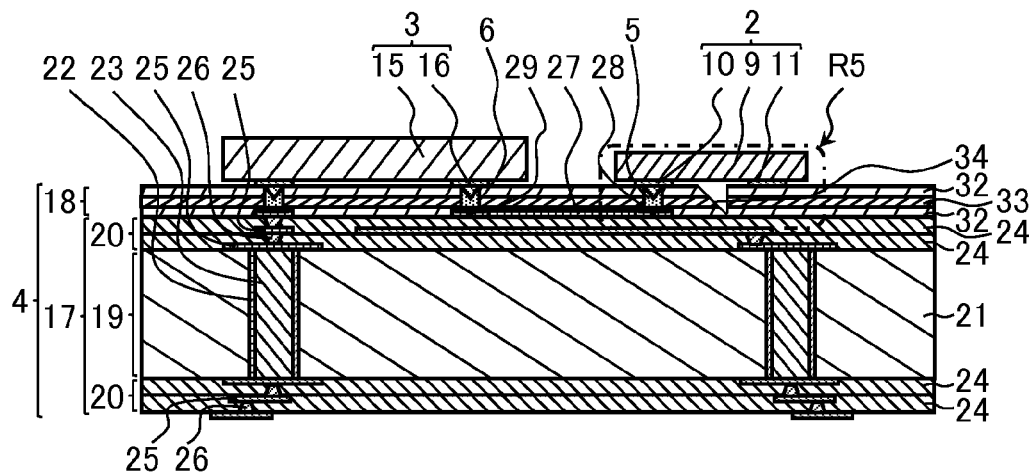
FIG. 7(a) is a thickness-wise sectional view of the optical module shown in FIG. 1(a), illustrating process steps for manufacturing the optical module.
FIGS. 7(b) and 7(c) are enlarged sectional views of a part R5 of FIG. 7(a), illustrating process steps for manufacturing the optical module.
Figure 7:
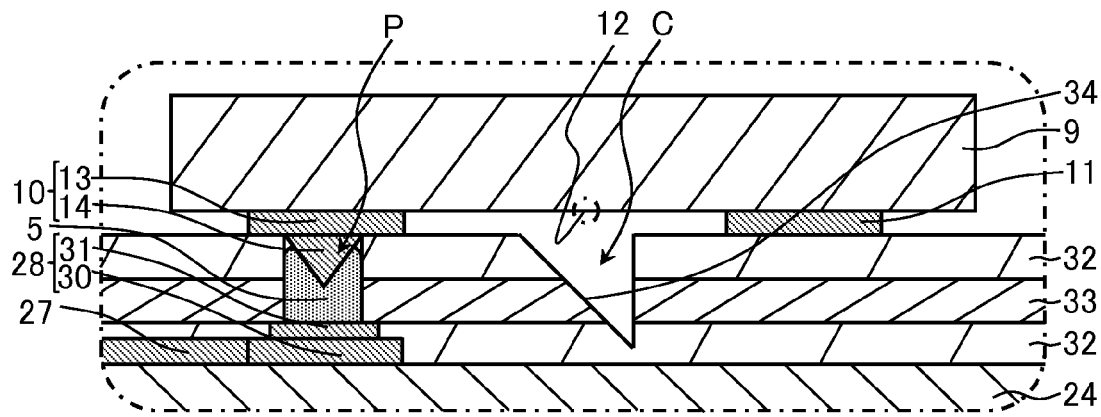
Figure 7:
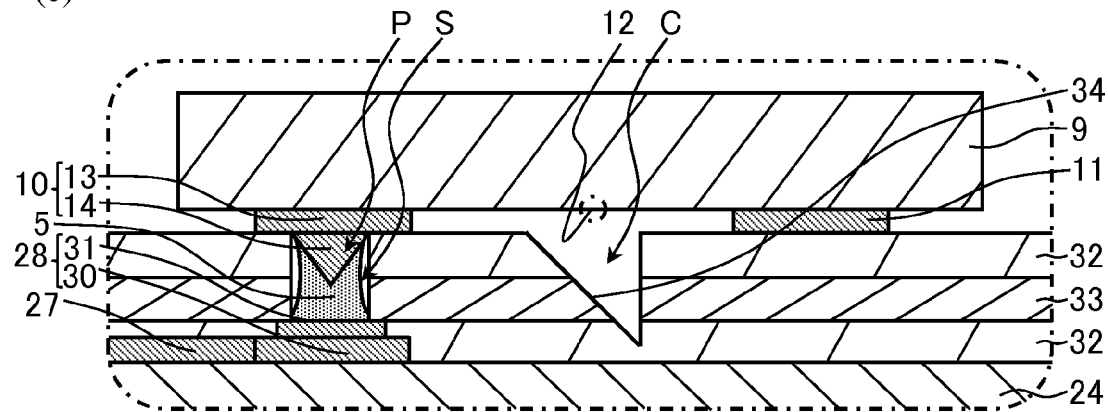
Figure 8:
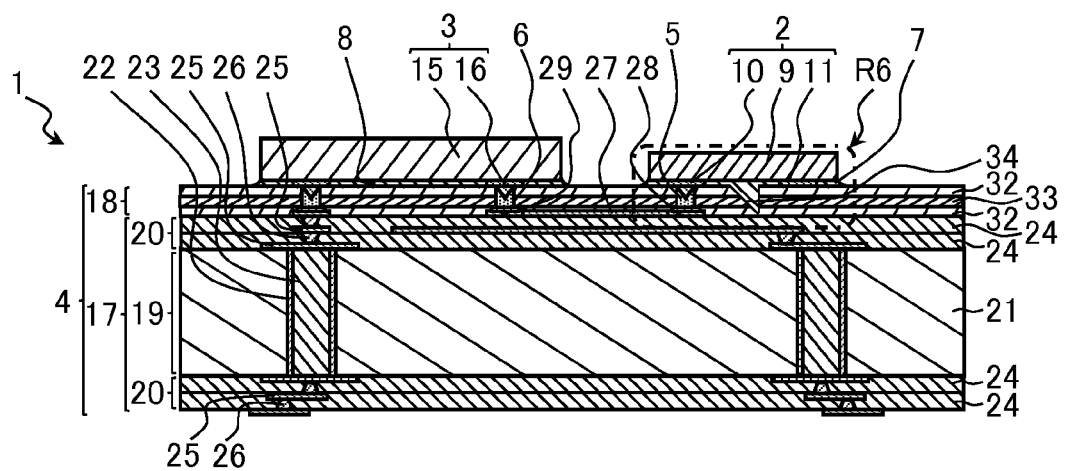
FIG. 8(a) is a thickness-wise sectional view of the optical module shown in FIG. 1(a), illustrating process steps for manufacturing the optical module.
FIG. 8(b) is an enlarged sectional views of a part R6 of FIG. 8(a), illustrating process steps for manufacturing the optical module.
Figure 8:
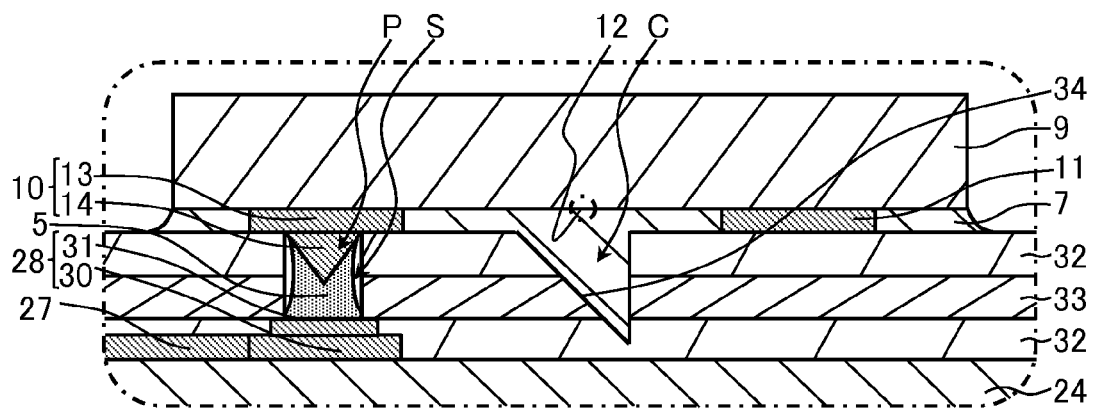

(4) As shown in FIG. 5(*a*), the cladding layer 32 and the core layer 33 are formed on the wiring substrate 17. The following is a concrete example of the procedure of formation.

At first, the flat first cladding layer is formed on the wiring substrate 17 by applying a precursor of the first cladding layer in an uncured state onto the wiring substrate 17 with use of a spin coater, a bar coater, a roll coater, a spray coater, or the like, with subsequent exposure of the first cladding layer precursor to light for development. Then, a narrow strip of core layer 33 is formed partly on the first cladding layer by applying a precursor of the core layer in an uncured state onto the first cladding layer, with subsequent exposure of the precursor to light with use of a mask for development. Next, the second cladding layer is formed on the first cladding layer and the core layer 33 by applying a precursor of the second cladding layer in an uncured state onto the first cladding layer so as to surround the core layer 33, with subsequent exposure of the second cladding layer precursor to light for development. The first and second cladding layers constitute the cladding layer 32.

By forming the first cladding layer so that its thickness is larger than the thickness of the electrode pad 28, it is possible to form the core layer 33 while suppressing deformation.

In the manner as above described, the cladding layer 32 and the core layer 33 can be formed.

(5) As shown in FIG. 5(b), the penetrating hole P passing through the cladding layer 32 and the core layer 33 is formed, and, as shown in FIG. 6(a), the conductive member 5, 6 is formed inside the penetrating hole P. The following is a concrete example of the procedure of formation.

At first, as shown in FIG. 5(c), by means of lasering, the penetrating hole P is formed so as to pass through the cladding layer 32 and the core layer 33 in its thickness direction to leave part of the main surface of the protrusion 31 exposed. Then, after a flux is applied onto the electrode pad 28, 29 left exposed inside the penetrating hole P, a solder ball is inserted into the penetrating hole P. Next, as the solder ball is subjected to heat for melting (reflow process), as shown in FIG. 6(b), the conductive member 5, 6 and the electrode pad 28, 29 become connected to each other while the surface of the electrode pad 28, 29 left exposed inside the penetrating hole P is being covered with the conductive member 5, 6. The conductive member 5, 6 takes on a cylindrical shape in the course of the heat for melting, and a cavity is created above the conductive member 5, 6 inside the penetrating hole P. The cylindrical conductive member 5, 6 has a surface curved convexly toward the cavity.

The penetrating hole P, being formed by means of lasering, can be made as a minute penetrating hole P.

Moreover, since the solder ball is inserted in the penetrating hole P, it follows that the optical waveguide 18 is located between the adjacent solder balls, with the consequent suppression of short-circuiting between the solder balls resulting from viscosity reduction ascribable to the flux or the heat for melting.

Further, since the conductive member 5, 6 and the electrode pad 28, 29 are connected to each other through the heat for melting of the solder ball inserted in the penetrating hole P, as compared to an electroplating case where smooth entry of a plating solution into a penetrating hole cannot be ensured if the penetrating hole has a high aspect ratio, it is possible to decrease the void between the conductive member 5, 6 and the electrode pad 28, 29.

Still further, since the solder ball is inserted into the penetrating hole P under the condition where the inner wall of the penetrating hole P is not subjected to any treatment such as plating and thus the optical waveguide 18 is left exposed, it is possible to increase the efficiency of insertion of the solder ball.

In addition, since the provision of the protrusion 31 below the penetrating hole P is conducive to reduction of the height of the penetrating hole P, when the conductive member 5, 6 is placed inside the penetrating hole P, it is possible to suppress creation of a gap between the conductive member 5, 6 and the electrode pad 28, 29, and thereby enhance the reliability of connection between the conductive member 5, 6 and the electrode pad 28, 29.

It is noted that no problem arises even if the solder ball inserted in the penetrating hole P partly comes out of the penetrating hole P.

(6) As shown in FIG. 6(c), the notch C is formed in the cladding layer 32 and the core layer 33, and the optical-path changing member 34 is formed on the inclined face of the notch C, thereupon the optical waveguide 18 is formed. In this way, the optical wiring board 4 can be produced. The following is a concrete example of the procedure of production.

At first, the notch C is formed by making an incision which extends from the surface of the cladding layer 32 toward the wiring substrate 17 with use of a dicing blade having a tip of desired shape. Subsequently, the optical-path changing member 34 is formed by means of vapor deposition, sputtering, or otherwise.

By forming the optical-path changing member 34 following the completion of formation of the conductive member 5, 6 in that way, contamination of the optical-path changing member 34 with a flux can be suppressed.

In the manner as above described, the optical waveguide 18 is formed on the wiring substrate 17, and thus the optical wiring board 4 can be fabricated.

(Mounting of Optical Semiconductor Device and Semiconductor Device)

(7) As shown in FIG. 7(a), the optical module 1 is produced by mounting the optical semiconductor device 2 and the semiconductor device 3 on the optical wiring board 4, and more specifically by placing the optical semiconductor device 2 and the semiconductor device 3 on the optical waveguide 18 of the optical wiring board 4, establishing connection between the connection pad 10, 16 and the electrode pad 28, 29 via the conductive member 5, 6, and forming the insulating member 7, 8 between the optical wiring board 4 and the optical semiconductor device 2 as well as the semiconductor device 3 as shown in FIG. 8(a). The following is a concrete example of the procedure of production.

To begin with, as shown in FIG. 7(b), the optical semiconductor device 2 and the semiconductor device 3 are placed on the optical waveguide 18 while inserting the projection 14 of the connection pad 10, 16 into the penetrating hole P, with at least part of the projection 14 embedded in the conductive member 5, 6. Then, as shown in FIG. 7(c), the conductive member 5, 6 is subjected to heat for melting, so that the conductive member 5, 6 and the connection pad 10, 16 can be connected to each other while the surface of the projection 14 is being covered with the conductive member under surface tension. The conductive member 5, 6 takes on a drum-like shape in the course of the heat for melting, and also a spacing S is created. Next, as shown in FIG. 8(b), the insulating member 7, 8 is formed by injecting a precursor of the insulating member containing an uncured resin in between the optical wiring board 4 and the optical semiconductor device 2 as well as the semiconductor device 3, and whereafter curing the uncured resin under heat.

Thus, since the projection 14 is inserted in the penetrating hole P for connection with the conductive member 5, it is possible to suppress positional deviation of the conductive member 5 during the heat for melting, and thereby maintain the proper positional relation between the light-receiving or light-emitting section 12 of the optical semiconductor device 2 and the optical-path changing member 34 of the optical waveguide 18. Moreover, since the projection 14 is fixedly inserted into the conductive member 5 inside the penetrating hole P, as the conductive member 5 flows over the surface of the projection 14 under surface tension during the heat for melting, the area of adhesion between the conductive member 5 and the projection 14 can be increased. This makes it possible to achieve firm connection between the connection pad 10 and the conductive member 5, and thereby enhance the reliability of electrical connection between the optical semiconductor device 2 and the optical wiring board 4.

Moreover, since the projection 14 of the connection pad 10, 16 is embedded in the conductive member 5, 6, it follows that the projection 14 penetrates the oxide film of the conductive member 5, 6, wherefore the projection 14 and the conductive member 5, 6 can be connected to each other without the necessity of using a flux. Alternatively, the projection 14 may be embedded in the conductive member 5, 6 after being coated with a flux.

Further, since the conductive member 5, 6 is disposed in the penetrating hole P, it follows that the optical waveguide 18 is located between the adjacent conductive members 5, 6, with the consequent suppression of short-circuiting between the conductive members 5, 6 resulting from the heat for melting.

In addition, the projection 14, being embedded in the conductive member 5, 6 having a surface curved convexly toward the cavity, can be embedded in the conductive member 5, 6 with ease.

In the manner as above described, the optical module 1 can be produced by mounting the optical semiconductor device 2 and the semiconductor device 3 on the optical wiring board 4 while establishing connection between the connection pad 10, 16 and the electrode pad 28, 29 via the conductive member 5, 6.

Second Embodiment

Next, the optical module in accordance with the second embodiment of the invention will be explained in detail with reference to FIGS. 9 to 11. Note that the description of the configurations thereof that are similar to those of the first embodiment will be omitted.

(Optical Module)

Figure 9:
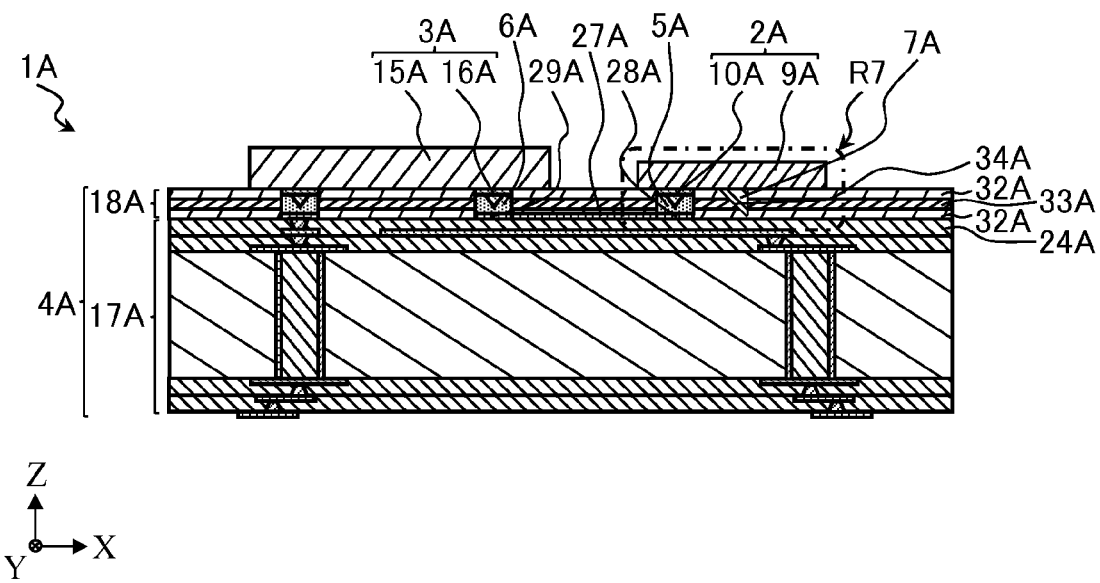
FIG. 9(a) is a thickness-wise sectional view of an optical module in accordance with a second embodiment of the invention.
FIG. 9(b) is an enlarged sectional view of a part R7 of FIG. 9(a)
Figure 9:
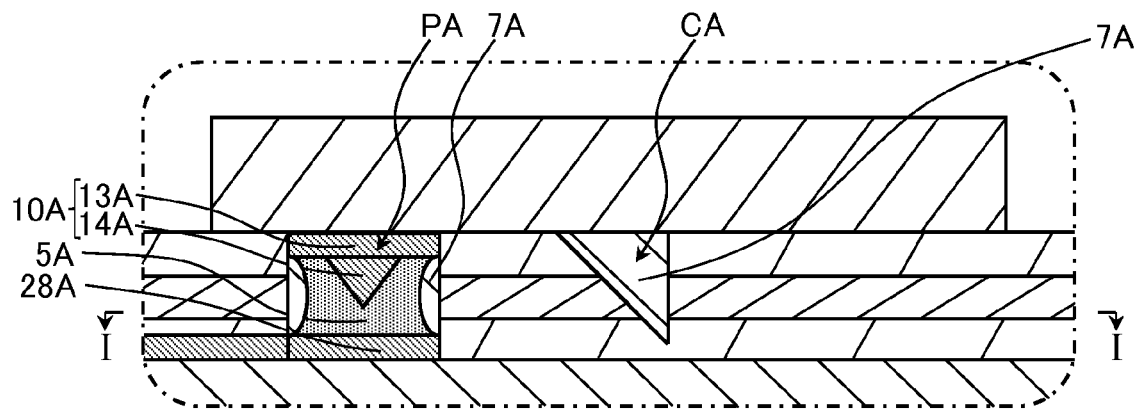
Figure 10:
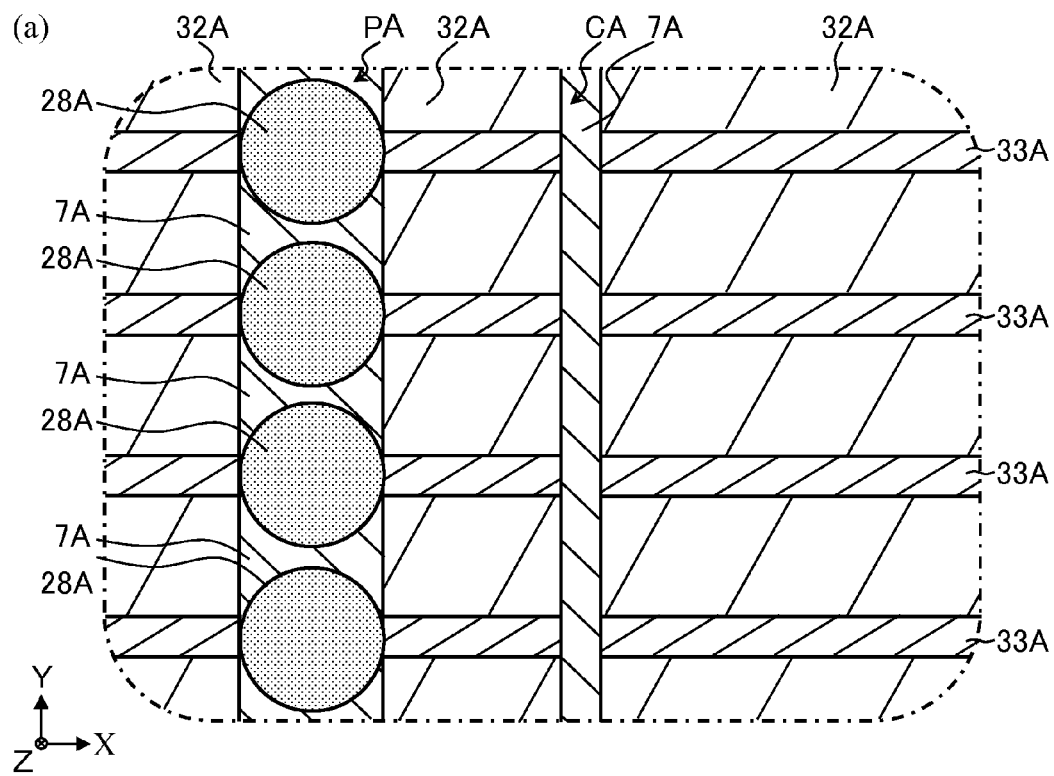
FIG. 10(a) is a sectional view taken along the line I-I of FIG. 9(b)
FIG. 10(b) is a three-dimensional representation of the optical waveguide of the optical module shown in FIG. 9(a)
Figure 10:
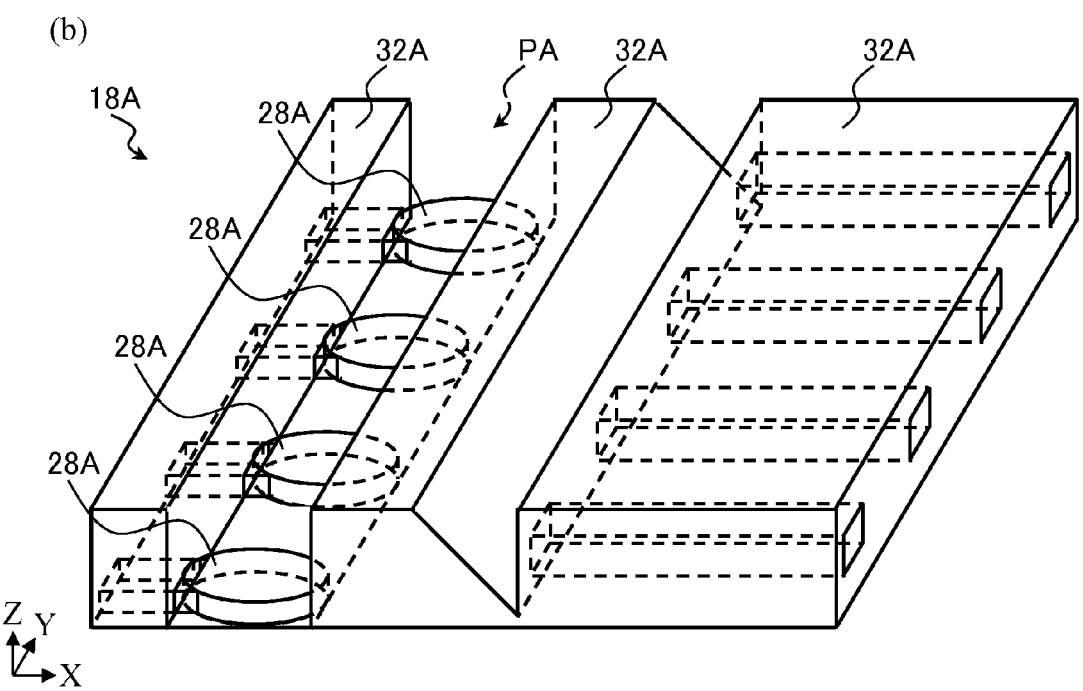
Figure 11:
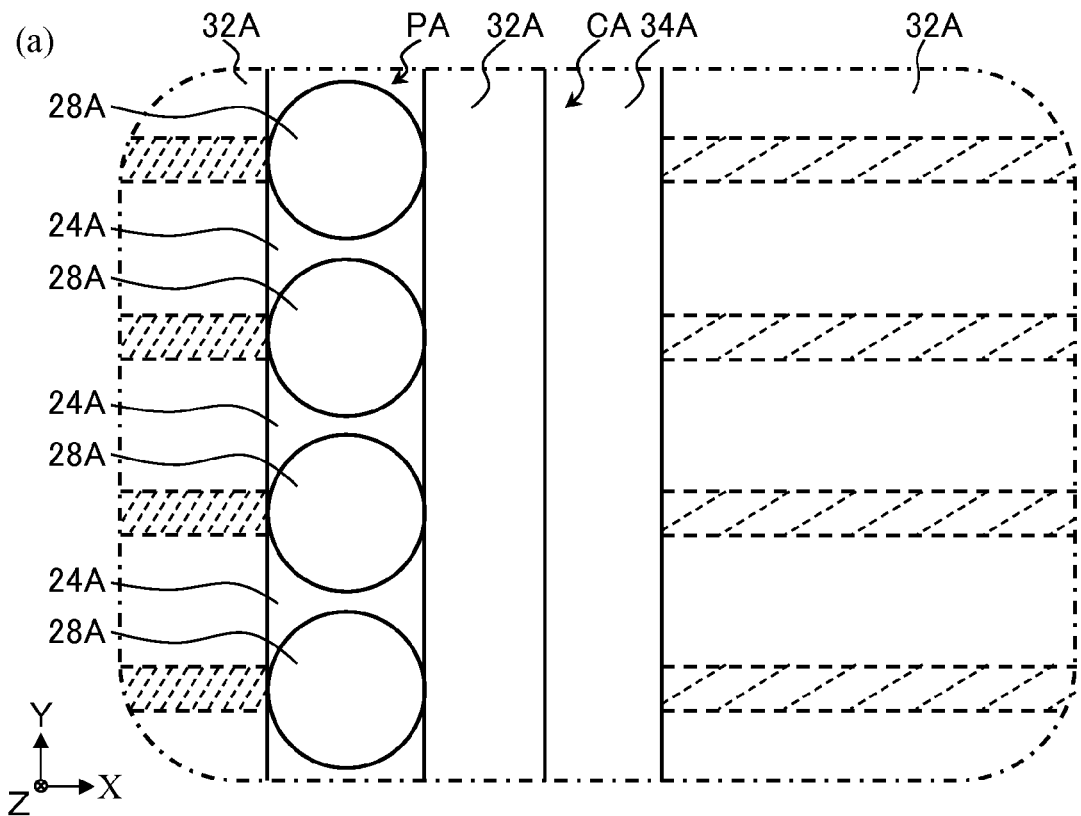
FIG. 11(a) is a top view of the construction shown in FIG. 10(b)
FIG. 11(b) is a three-dimensional representation showing the structure of connection between an electrode pad and a connection pad of the optical module shown in FIG. 9(a)
Figure 11:
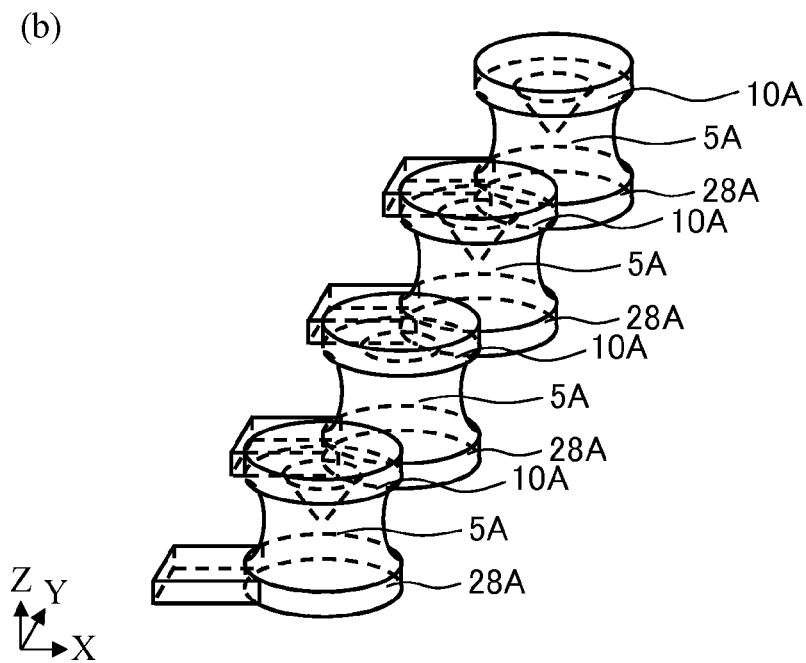

In the second embodiment which differs from the first embodiment, as shown in FIGS. 9 to 11, a plurality of electrode pads 28A are left exposed inside a penetrating hole PA, and an electrically conductive member 5 is connected to each of the plurality of electrode pads 28A, and also a connection pad 10A is connected to each of the conductive members 5A. As a result, in contrast to the first embodiment, the need to create the penetrating hole PA by means of micromachining is reduced, wherefore the penetrating hole PA can be formed with ease, and also the surface of the electrode pad 28A left exposed inside the penetrating hole PA can be broadened, with consequent enhancement in the reliability of connection between the electrode pad 28A and the conductive member 5A. Moreover, since the surface of the electrode pad 28A left exposed inside the penetrating hole PA can be broadened, in contrast to the first embodiment, even if the electrode pad 28A is composed solely of a pad portion without forming a projection, the reliability of connection between the electrode pad 28A and the conductive member 5A can be ensured.

Moreover, as shown in FIGS. 10(b) and 11(a), one main surface of the electrode pad 28A is entirely exposed inside the penetrating hole PA. This makes it possible to increase the area of connection between the electrode pad 28A and the conductive member 5A even further.

Further, the penetrating hole PA is given the form of a narrow strip extending along the direction of arrangement of the electrode pads 28A (Y direction). As a result, a wiring conductor 27A is less likely to be exposed inside the penetrating hole PA, wherefore variations in the height of the conductive member 5A resulting from the flow of the conductive member 5A toward the wiring conductor 27A can be suppressed. The width of the penetrating hole PA should preferably be equal to the width of the electrode pad 28A, and is thus adjusted to be 0.9 or more to 1.1 or less times as large as the width of the electrode pad 28A, for example.

In addition, as shown in FIGS. 9(b) and 10(a), each of the plural conductive members 5A is surrounded by an insulating member 7A inside the penetrating hole PA. This makes it possible to suppress short-circuiting between the conductive members 5A inside the penetrating hole PA.

Unlike the first embodiment, in the second embodiment, as shown in FIG. 9(b), a pad portion 13A of the connection pad 10A stays inside the penetrating hole PA. As a result, an optical semiconductor device 2A and an optical waveguide 18A become closer to each other.

Moreover, the optical semiconductor device 2A does not have a dummy pad, and more specifically a main surface on the optical waveguide 18A side of an optical semiconductor substrate 9A is free of a dummy pad and thus abuts on the optical waveguide 18A. As a result, the optical semiconductor device 2A and the optical waveguide 18A become even closer to each other, and also the inclination of the optical semiconductor device 2A relative to the optical waveguide 18A can be suppressed.

It is noted that a semiconductor device 3A is mounted on an optical wiring board 4A similarly to the optical semiconductor device 2A.

(Method for Manufacturing Optical Module)

Next, a method for manufacturing the optical module 1A of the second embodiment thus far described will be explained. Note that the description of the process steps thereof that are similar to those of the first embodiment will be omitted.

In the process step (4) of the first embodiment described previously, at the time of exposing the first cladding layer precursor, the core layer precursor, and the second cladding layer precursor to light for development, patterning is performed with use of a mask so that the penetrating hole PA can be created by piercing a part of each of the first cladding layer, the core layer, and the second cladding layer which corresponds to the penetrating hole PA. As a result, a narrow strip of penetrating hole PA can be formed with ease.

Moreover, in the process step (5) of the first embodiment described previously, at the time of placing a solder ball on the electrode pad 28A, 28A, a flux is selectively applied onto the electrode pad 28A, 28A by a transfer method for emplacement of the solder ball on the electrode pad 28A, 28A. This makes it possible to achieve flux reduction between the adjacent electrode pads 28A, as well as between the adjacent electrode pads 29A, and thereby suppress contact between the adjacent solder balls ascribable to the flux. Further, the conductive member 5A, 6A which has been melted under heat in the process step (5) takes on the shape of a hemisphere having a flat face at its junction with the electrode pad 28A, 28A.

Moreover, in the process step (7) of the first embodiment described previously, the pad portion 13A and a projection 14A of the connection pad 10A, 16A are inserted into the penetrating hole PA, with at least part of the projection 14A embedded in the conductive member 5A, 6A. Then, the conductive member 5A, 6A is subjected to heat for melting, so that the conductive member 5A, 6A and the connection pad 10A, 16A can be connected to each other. Next, the insulating member 7A, 8A for surrounding each of the conductive members 5A, 6A is formed by injecting, from an opening on the optical waveguide 18A side of the penetrating hole PA, a precursor of the insulating member into the penetrating hole PA so as to surround each of the conductive members 5A, 6A, with subsequent curing treatment under heat.

At the time of the injection of the insulating member precursor into the penetrating hole PA in the process step (7) just described, by injecting the insulating member precursor into a notch CA just as with the precursor injection into the penetrating hole PA, the insulating member 7A can be formed inside the notch CA.

In the manner as above described, the optical module 1A can be fabricated.

It should be understood that the invention is not limited to the embodiments described heretofore, and that various changes, modifications, and combinations are possible without departing from the scope of the invention.

For example, although the first and second embodiments of the invention have been described with respect to the case where the optical semiconductor device comprises the optical semiconductor substrate and the connection pad, it is possible to adopt, as the optical semiconductor device, a structure constructed by mounting an optical semiconductor substrate on a ceramic board.

Moreover, although the first embodiment of the invention has been described with respect to the case where the optical semiconductor device includes the dummy pad, the optical semiconductor device does not necessarily have to include the dummy pad. In this case, the optical semiconductor device can be supported by inserting the projection into the penetrating hole so as to be embedded in the conductive member, and also the inclination of the optical semiconductor device can be suppressed.

Moreover, although the first and second embodiments of the invention have been described with respect to the case where two insulating layers are stacked together to constitute the wiring layer, any number of insulating layers may be provided.

Moreover, although the first and second embodiments of the invention have been described with respect to the case where the insulating layer is made of a resin layer, a ceramic layer may be adopted for use as the insulating layer.

Moreover, although the first and second embodiments of the invention have been described with respect to the case where the wiring substrate is constructed of a resin substrate, a metal core substrate formed of a resin-covered metal plate or a ceramic substrate may be adopted for use as the wiring substrate.

Moreover, although the first and second embodiments of the invention have been described with respect to the case where the optical-path changing member has the form of a metallic film, changes in optical path may be effected by any other means than the metallic film.

Figure 12:
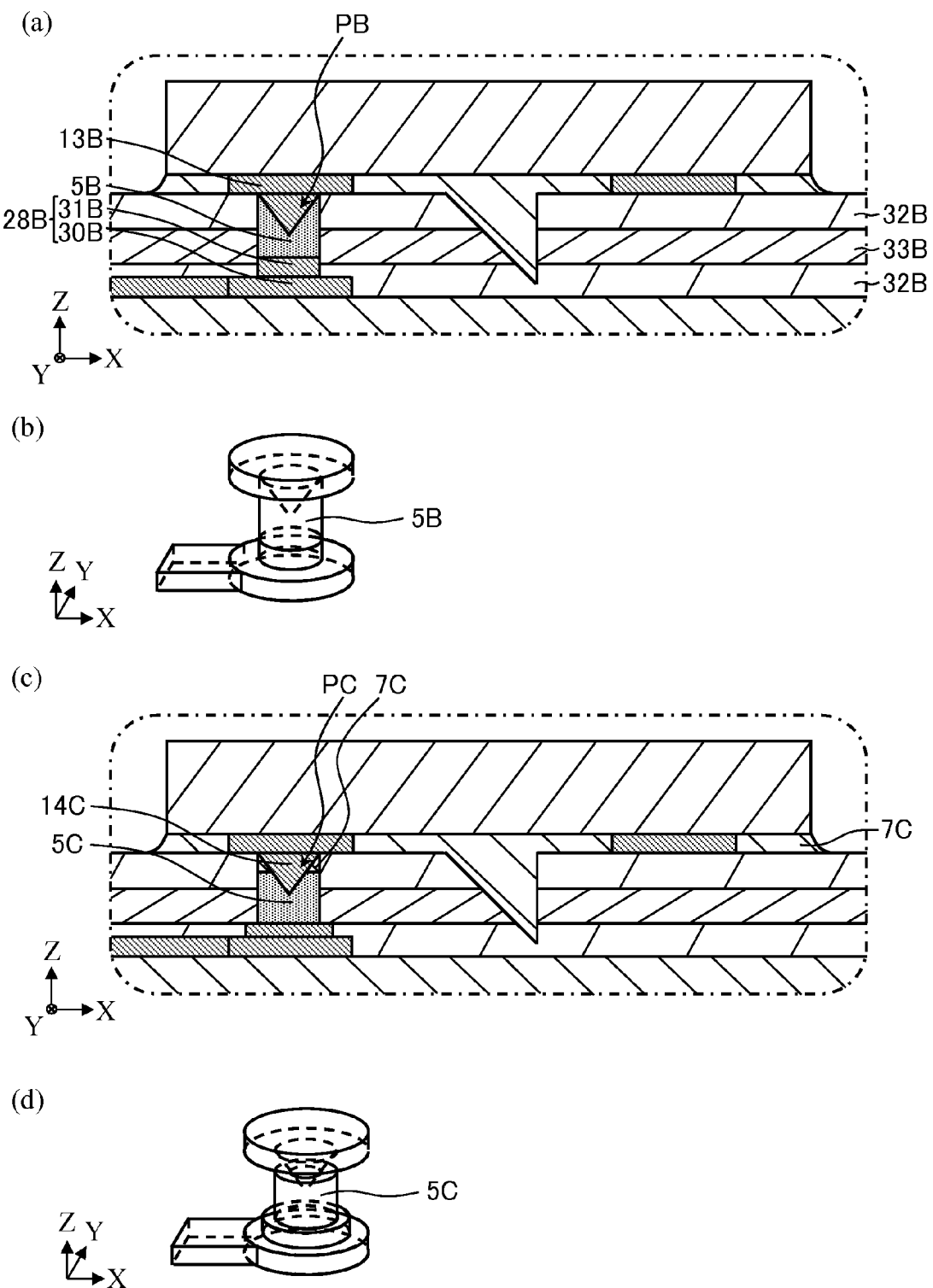
FIG. 12(a) is a sectional view showing a part of an optical module of another embodiment of the invention in correspondence with FIG. 1(a)
FIG. 12(b) is a three-dimensional representation showing the structure of connection between an electrode pad and a connection pad of the optical module shown in FIG. 12(a)
FIG. 12(c) is a sectional view showing a part of an optical module of another embodiment of the invention in correspondence with FIG. 1(a)
FIG. 12(d) is a three-dimensional representation showing the structure of connection between an electrode pad and a connection pad of the optical module shown in FIG. 12(c).

Further, although the first and second embodiments of the invention have been described with respect to the case where the conductive member takes on a drum-like shape following mounting of the optical semiconductor device on the optical wiring board, as shown in FIGS. 12(a) and 12(b), the conductive member 5B may be filled in the penetrating hole PB so that it assumes a cylindrical shape and no spacing is created in the penetrating hole. The conductive member 5B can be formed by making adjustment to the size of the solder ball in the process step (5) described earlier. Note that no problem arises even if the conductive member 5B partly comes out of the penetrating hole P and finds its way into a region between a pad portion 13B and a cladding layer 32B.

Still further, although the first embodiment of the invention has been described with respect to the case where part of the main surface of the protrusion is left exposed inside the penetrating hole, as shown in FIGS. 12(a) and 12(b), a protrusion 31B may be located inside the penetrating hole PB. In this case, the junction between an electrode pad 28B and the conductive member 5B is fixedly disposed inside the penetrating hole PB, wherefore the strength of connection between the electrode pad 28B and the conductive member 5B can be increased. The protrusion 31B can be formed in, instead of the above-mentioned process step (3), the above-mentioned process step (5) by means of electroless plating, electrolytic plating, or otherwise following the completion of formation of the penetrating hole PB. In this case, the thickness of the protrusion 31B can be increased, and also the electrode pad 28B can be made larger in thickness than the first cladding layer, without exerting any influence on the deformation of a core layer 33B.

In addition, although the first embodiment of the invention has been described with respect to the case where the insulating member is not situated inside the penetrating hole, as shown in FIGS. 12(c) and 12(d), an insulating member 7C may be disposed inside a penetrating hole PC. In forming the insulating member 7C, after a projection 14C is embedded in a conductive member 5C, the insulating member 7C is so shaped as to be partly located inside the penetrating hole PC, and then heat is applied to the conductive member 5C to melt it for connection with the projection 14C.

REFERENCE SIGNS LIST

1: Optical module
2: Optical semiconductor device
3: Semiconductor device
4: Optical wiring board
5, 6: Electrically conductive member
7, 8: Insulating member
9: Optical semiconductor substrate
10: Connection pad
11: Dummy pad
12: Light-receiving or light-emitting section
13: Pad portion
14: Projection
15: Semiconductor substrate
16: Connection pad
17: Wiring substrate
18: Optical waveguide
19: Core substrate
20: Wiring layer
21: Resin substrate
22: Through-hole conductor
23: Insulator
24: Insulating layer
25: Electrically conductive layer
26: Via-conductor
27: Wiring conductor
28, 29: Electrode pad
30: Land portion
31: Protrusion
32: Cladding layer
33: Core layer
34: Optical-path changing member
C: Notch
P: Penetrating hole
S: Spacing

The invention claimed is:

1. An optical module, comprising:
a wiring substrate comprising an electrode pad on an upper surface thereof;
an optical waveguide disposed on the upper surface of the wiring substrate;
an optical semiconductor device mounted on an upper surface of the optical waveguide, and comprising a connection pad disposed on a lower surface of the optical semiconductor device; and
an electrically conductive member for providing electrical connection between the electrode pad and the connection pad,
the optical waveguide comprising a hole passing therethrough in its thickness direction to leave the electrode pad exposed,
the connection pad comprising a projection which is at least partly inserted in the hole,
the conductive member being disposed inside the hole, and making connection with the projection and the electrode pad,
wherein the connection pad further comprises a pad portion, to one part of which the projection is connected, and
another part of the pad portion abuts on the upper surface of the optical waveguide.

2. The optical module according to claim 1,
wherein the optical semiconductor device further comprises a dummy pad disposed on a lower surface of the optical semiconductor, and
the dummy pad abuts on the optical waveguide.

3. The optical module according to claim 2,
wherein a thickness of the dummy pad is equal to a thickness of the pad portion of the connection pad.

4. The optical module according to claim 3,
wherein the thickness of the dummy pad is 0.9 or more to 1.1 or less times the thickness of the pad portion of the connection pad.

5. The optical module according to claim 1,
wherein the electrode pad comprises a land portion on the upper surface of the wiring substrate, and a protrusion on the land portion protruding the hole for connection with the conductive member.

6. The optical module according to claim 1,
wherein a plurality of electrode pads are disposed on one and a same main surface of the wiring substrate,
the plurality of electrode pads are left exposed inside a single hole,
a plurality of conductive members are disposed in the single hole making connection with their respective electrode pads, and
the optical semiconductor device has a plurality of connection pads connected to their respective conductive members.

7. The optical module according to claim 6,
wherein the plurality of electrode pads are aligned along one direction, and
the single hole has a shape of a narrow strip extending along the one direction.

8. The optical module according to claim 6,
wherein an insulating member is disposed inside the single hole surrounding each of the plurality of conductive members.

9. The optical module according to claim 1,
wherein the pad portion is disposed on the lower surface of the optical semiconductor device.

10. An optical wiring board, comprising:
a wiring substrate comprising an electrode pad disposed on a main surface thereof; and
an optical waveguide disposed on the main surface of the wiring substrate,
the optical waveguide comprising a hole passing therethrough in its thickness direction to leave the electrode pad exposed,
wherein a plurality of electrode pads are disposed on one and a same main surface of the wiring substrate,
the plurality of electrode pads are left exposed inside a single hole,
the plurality of electrode pads are aligned along one direction, and
the single hole has a shape of a narrow strip extending along the one direction.

* * * * *